(12) United States Patent
Anand et al.

(10) Patent No.: US 11,169,872 B2
(45) Date of Patent: Nov. 9, 2021

(54) CIRCUIT DEVICE, ELECTRONIC APPARATUS, AND ERROR DETECTION METHOD

(71) Applicant: SEIKO EPSON CORPORATION, Tokyo (JP)

(72) Inventors: Kumar anandabairavasamy Anand, Richmond (CA); Peter van baarsen John, Delta (CA); Wittmeir Manfred, Aichach (DE)

(73) Assignee: SEIKO EPSON CORPORATION, Tokyo (JP)

( * ) Notice: Subject to any disclaimer, the term of this patent is extended or adjusted under 35 U.S.C. 154(b) by 95 days.

(21) Appl. No.: 16/129,151

(22) Filed: Sep. 12, 2018

(65) Prior Publication Data

US 2019/0250981 A1 Aug. 15, 2019

(30) Foreign Application Priority Data

Feb. 14, 2018 (JP) .............................. JP2018-023787

(51) Int. Cl.
*G06F 11/10* (2006.01)
*G06F 11/00* (2006.01)
(Continued)

(52) U.S. Cl.
CPC ...... *G06F 11/1004* (2013.01); *G06F 11/1048* (2013.01); *G06T 7/0004* (2013.01);
(Continued)

(58) Field of Classification Search
CPC .... G06F 11/1004; G06F 11/1048; G06T 7/00; G09G 5/14; G09G 2340/12; H03M 13/09
See application file for complete search history.

(56) References Cited

U.S. PATENT DOCUMENTS 4,887,305 A 12/1989 Shimura
5,546,475 A 8/1996 Bolle et al.
(Continued)

FOREIGN PATENT DOCUMENTS

JP S59-116879 A 7/1984
JP H08-152309 A 6/1996
(Continued)

OTHER PUBLICATIONS

Jul. 2, 2019 Extended European Search Report issued in European Patent Application No. 19156645.4.
(Continued)

*Primary Examiner* — Justin R Knapp
(74) *Attorney, Agent, or Firm* — Oliff PLC

(57) ABSTRACT

Provided is a circuit device that can appropriately detect an error in a display image obtained by performing image processing, an electronic apparatus, an error detection method, and the like. A circuit device includes an image acquisition circuit configured to acquire image data, and an index acquisition circuit configured to obtain an index for performing error detection on a display image based on the image data. The index acquisition circuit obtains an index that represents the degree of dissimilarity between a foreground image, which is an image of a given region of the display image, and a background image, of the display image, corresponding to a background of the foreground image. The index is obtained based on pixel values of the display image.

16 Claims, 13 Drawing Sheets

(51) Int. Cl.
 *H03M 13/09* (2006.01)
 *G09G 5/14* (2006.01)
 *G06T 7/00* (2017.01)

(52) U.S. Cl.
 CPC ............. *G09G 5/14* (2013.01); *H03M 13/09* (2013.01); *G09G 2340/12* (2013.01)

(56) References Cited

U.S. PATENT DOCUMENTS

| | | | |
|---|---|---|---|
| 5,640,200 A * | 6/1997 | Michael | G06T 7/001 348/126 |
| 5,699,454 A | 12/1997 | Nakai et al. | |
| 5,949,901 A | 9/1999 | Nichani et al. | |
| 6,333,991 B1 | 12/2001 | Schreiber et al. | |
| 6,754,367 B1 | 6/2004 | Ito et al. | |
| 6,757,421 B1 | 6/2004 | Kubo | |
| 6,778,684 B1 | 8/2004 | Bollman | |
| 8,837,829 B2 | 9/2014 | Shimizu | |
| 2002/0158199 A1 | 10/2002 | Takane et al. | |
| 2003/0173516 A1 | 9/2003 | Takane et al. | |
| 2003/0185431 A1 | 10/2003 | Hong et al. | |
| 2004/0002984 A1 | 1/2004 | Hasegawa et al. | |
| 2004/0061782 A1 | 4/2004 | Kinjo | |
| 2004/0081350 A1 | 4/2004 | Kitamura et al. | |
| 2004/0131281 A1 | 7/2004 | Reiners | |
| 2006/0110009 A1 | 5/2006 | Klassen et al. | |
| 2007/0078922 A1 | 4/2007 | Sano et al. | |
| 2007/0194236 A1 | 8/2007 | Takane et al. | |
| 2008/0036899 A1 | 2/2008 | Yamashita | |
| 2008/0285861 A1 | 11/2008 | Mitarai et al. | |
| 2010/0027893 A1 | 2/2010 | Hayber | |
| 2010/0061629 A1 | 3/2010 | Ma | |
| 2010/0124362 A1 | 5/2010 | Wu et al. | |
| 2011/0141353 A1 | 6/2011 | Wong et al. | |
| 2012/0036418 A1 | 2/2012 | Morino et al. | |
| 2012/0182571 A1 | 7/2012 | Wu et al. | |
| 2015/0221077 A1 | 8/2015 | Kawabata et al. | |
| 2015/0302568 A1 | 10/2015 | Hirai et al. | |
| 2016/0173944 A1 | 6/2016 | Kilar et al. | |
| 2017/0272740 A1 | 9/2017 | Clark, II et al. | |
| 2018/0210774 A1 | 7/2018 | Young et al. | |

FOREIGN PATENT DOCUMENTS

| | | | |
|---|---|---|---|
| JP | 2002-328015 A | 11/2002 | |
| JP | 2007-072394 A | 3/2007 | |
| JP | 2007-101691 A | 4/2007 | |
| JP | 2008-287437 A | 11/2008 | |
| JP | 2010-039657 A | 2/2010 | |
| JP | 2012-035677 A | 2/2012 | |
| WO | WO-2007093199 A2 * | 8/2007 | ............... G06T 7/11 |
| WO | 2018/034214 A1 | 2/2018 | |

OTHER PUBLICATIONS

Fujitsu Semiconductor et al.: "MB88F33x 'Indigo2(-x)'— Hardware Manual", pp. 1-496, (Nov. 12, 2013).

Farrugia, R.A. et al., "Enhancing the Error Detection Capabilities of the Standard Video Decoder using Pixel Domain Dissimilarity Metrics," pp. 1085-1090, Eurocon 2007, The International Conference on "Computer as a Tool", Warsaw, Sep. 9-12, 2007.

* cited by examiner

CIRCUIT DEVICE, ELECTRONIC APPARATUS, AND ERROR DETECTION METHOD

BACKGROUND

This application claims the benefit of priority from Japanese Patent Application No. 2018-023787 filed Feb. 14, 2018, the entire contents of which are incorporated herein by reference.

1. Technical Field

The present disclosure relates to a circuit device, an electronic apparatus, an error detection method, and the like.

2. Related Art

In display control in a display device (liquid-crystal display device, for example), a processing device such as a CPU transmits image data and a control signal to a display controller, the display controller performs image processing and generates a timing signal, and a display driver drives a display panel using the image data subjected to the image processing and the timing signal. An LVDS (Low Voltage Differential Signal) method, an RGB serial method, or the like is used when image data is transmitted from the processing device to the display controller. There are cases where a data error due to a communication error or the like occurs in image data that the display controller has received. For example, a technique in which a display controller detects an error in image data received from a processing device using CRC (Cyclic Redundancy Check) is disclosed in JP-A-2012-35677, JP-A-2007-101691, and JP-A-2007-72394.

In error detection using CRC, a processing device obtains a CRC value from image data, transmits the image data and the CRC value to a display controller, and the display controller obtains a CRC value from the received image data, and compares the obtained CRC value with the CRC value received from the processing device. In this method, whether or not the received image data matches the image data that the processing device has transmitted is verified. Therefore, when image processing is performed on the received image data, error detection using the received CRC value cannot be performed. Specifically, when an image subjected to the image processing is to be displayed, an error in a display image cannot be properly detected in error detection using the known CRC.

Also, when bit-wise error detection such as CRC is used, a one-bit error included in image data can be detected, for example. However, even if a minute error such as a one-bit error is included in image data, the image that is actually displayed does not substantially differ from the original image, and the likelihood that a user will erroneously recognize the image (erroneously recognizes the displayed image as an image different from the original image) is considered to be low. In bit-wise error detection such as CRC, such a minute error is detected as well, therefore the bit-wise error detection is not appropriate to be used for the purpose of properly detecting an error that will cause a user to erroneously recognize the image. For example, bit-wise error detection is not appropriate for determining whether or not, in the case where an icon or the like is displayed in a display image, a user can correctly recognize an icon or the like.

SUMMARY

According to some aspects of the present disclosure, a circuit device that can appropriately detect an error in a display image obtained by performing image processing, an electronic apparatus, an error detection method, and the like can be provided.

One aspect of the present disclosure relates to a circuit device including: an image acquisition circuit configured to acquire image data; and an index acquisition circuit configured to obtain an index for performing error detection on a display image based on the image data. The index acquisition circuit is configured to obtain the index representing a degree of dissimilarity between a foreground image, which is an image of a given region of the display image, and a background image, of the display image, corresponding to a background of the foreground image, based on pixel values of the display image.

Also, in one aspect, the circuit device may further include an image processing circuit configured to perform image processing on the image data so as to generate the display image. The index acquisition circuit may obtain the index based on pixel values of the display image generated by the image processing circuit.

Also, in one aspect, the index acquisition circuit may statistically obtain the index based on pixel values of the display image.

Also, another aspect of the present disclosure relates to a circuit device including: an image acquisition circuit configured to acquire image data; an image processing circuit configured to perform image processing on the image data so as to obtain a display image; and an index acquisition circuit configured to obtain an index for performing error detection on the display image. The index acquisition circuit is configured to obtain an index representing a degree of matching between a foreground image, which is an image of a given region of the display image, and a reference image, which is a reference with respect to the foreground image, based on pixel values of the display image and pixel values of the reference image or based on pixel values of an edge image of the display image and pixel values of an edge image of the reference image.

Also, in another aspect, the circuit device may further include an index register for storing the index.

Also, in another aspect, the circuit device may further include an error detection circuit configured to perform the error detection on the display image based on the index.

Also, in another aspect, the error detection circuit may perform the error detection by comparing a threshold value for determining an error in the display image and the index.

Also, in another aspect, the circuit device may further include a threshold value register in which the threshold value is set.

Also, in another aspect, the circuit device may further include a memory into which first to $n^{th}$ images are stored as the foreground images. First to $n^{th}$ threshold values corresponding to the first to $n^{th}$ images are set in the threshold value register as the threshold values, and the error detection circuit may, when the error detection is performed on the display image that includes an $i^{th}$ image of the first to $n^{th}$ images as the foreground image, perform the error detection using an $i^{th}$ threshold value of the first to $n^{th}$ threshold values.

Also, in another aspect, the circuit device may further include an operation mode setting register in which an operation mode of the circuit device when an error is determined in the display image by the error detection circuit is set.

Also, in another aspect, in the operation mode setting register, a mode of reporting a result of the error detection to a device external to the circuit device, a mode of not displaying the display image, and a mode of displaying a specific image as the display image, may be set as the operation modes.

Also, in another aspect, the circuit device may further include a memory for storing first to $n^{th}$ images as the foreground images; and an operation mode setting register in which first to $n^{th}$ operation modes corresponding to the first to $n^{th}$ images are set. An $i^{th}$ operation mode of the first to $n^{th}$ operation modes may be the operation mode of the circuit device when an error is determined in the display image by the error detection circuit, when the error detection circuit has performed the error detection on the display image including an $i^{th}$ image of the first to $n^{th}$ images as the foreground image.

Also, yet another aspect of the present disclosure relates to an electronic apparatus including the circuit device according to any of the above descriptions.

Also, yet another aspect of the present disclosure relates to an error detection method including: acquiring image data; and obtaining an index that represents a degree of dissimilarity between a foreground image, which is an image of a given region of a display image based on the image data, and a background image, of the display image, corresponding to a background of the foreground image, as the index for performing error detection on the display image, based on pixel values of the display image.

Also, yet another aspect of the present disclosure relates to an error detection method including: acquiring image data; generating a display image by performing image processing on the image data; and obtaining an index that represents a degree of matching between a foreground image, which is an image of a given region of the display image, and a reference image, which is a reference with respect to the foreground image, based on pixel values of the display image and pixel values of the reference image, or based on pixel values of an edge image of the display image and pixel values of an edge image of the reference image, as the index for performing error detection on the display image.

BRIEF DESCRIPTION OF THE DRAWINGS

The embodiments will be described with reference to the accompanying drawings, wherein like numbers reference like elements.

DESCRIPTION OF EXEMPLARY EMBODIMENTS

The following is a detailed description of exemplary embodiments of the invention. Note that the embodiments described below are not intended to unduly limit the content of the invention recited in the claims, and all of the configurations described in the embodiments are not necessarily essential as solutions provided by the invention.

1. Circuit Device

Figure 1:
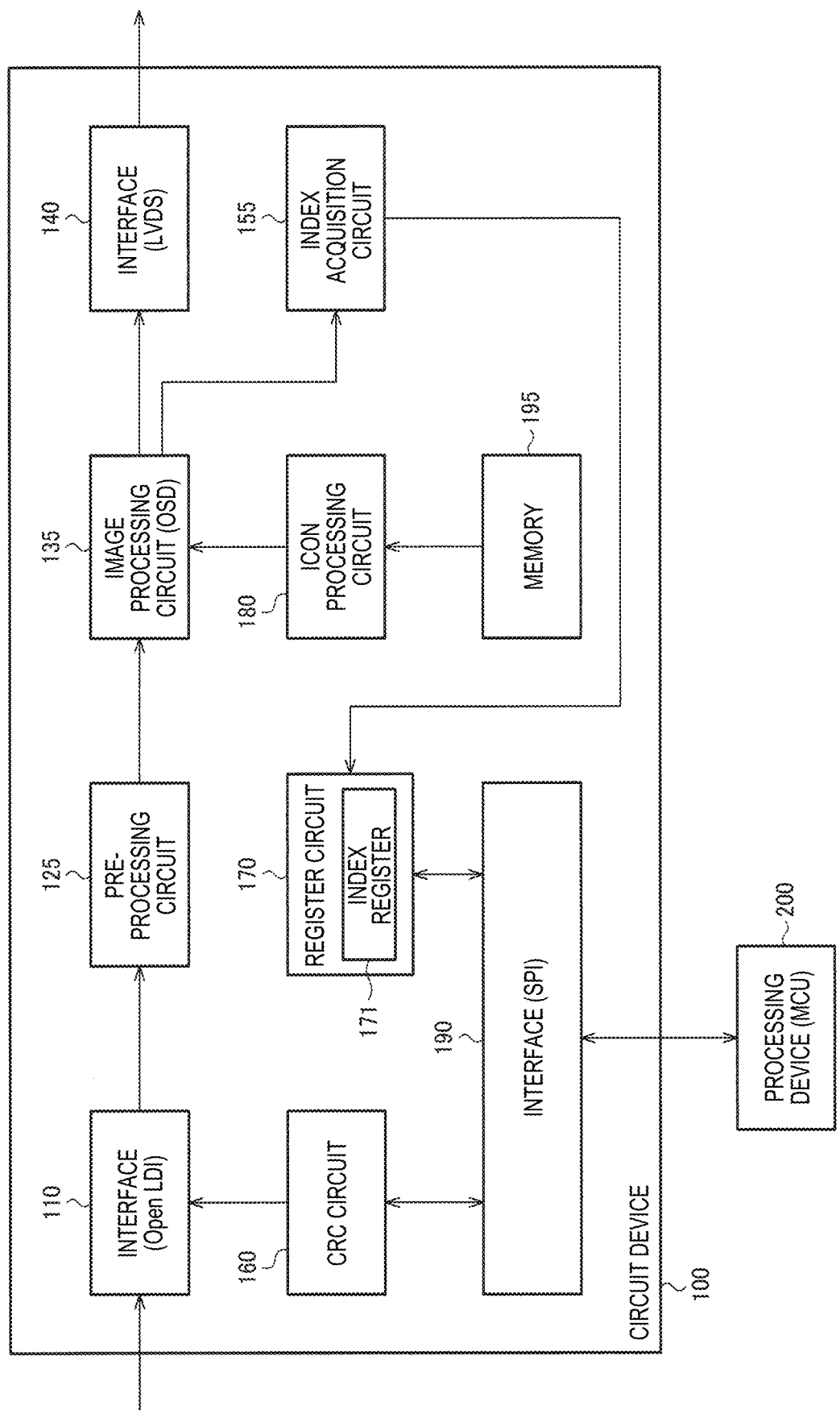
FIG. 1 shows a first exemplary configuration of a circuit device of a present embodiment.

FIG. 1 shows a first exemplary configuration of a circuit device of a present embodiment. A circuit device 100 includes an interface 110 (first interface), a pre-processing circuit 125, an image processing circuit 135, an interface 140 (second interface), an index acquisition circuit 155, a CRC circuit 160, a register circuit 170, an icon processing circuit 180, an interface 190 (third interface), and a memory 195. The circuit device 100 is an integrated circuit device (IC), for example.

The interface 110 receives image data that is transmitted from a processing device 200 or the like to the circuit device 100, and converts the received image data to a format that is used inside the circuit device 100, for example. The interface 110 is also referred to as an image acquisition circuit. For example, the interface 110 is an OpenLDI (Open LVDS Display Interface), and converts a serial signal received using LVDS (Low Voltage Differential Signaling) to an RGB parallel signal. The processing device 200 is an SoC (System on a Chip), an MCU (Micro Control Unit), a CPU (Central Processing Unit), and the like.

The pre-processing circuit 125 performs various types of image processing on image data that is input from the interface 110. For example, the pre-processing circuit 125 performs gamma correction, FRC (Frame Rate Control), white balance processing, and the like. For example, a one-dimensional lookup table for each of an R channel, a G channel, and a B channel is stored in the memory 195, the register circuit 170, or an unshown nonvolatile memory, and gamma correction is performed on the channels using the respective lookup tables. In the FRC, processing to express an intermediate tone in a pseudo manner is performed by switching tones between frames. In the white balance processing, a one-dimensional lookup table for adjusting the white balance is stored in the memory 195, the register circuit 170, or an unshown nonvolatile memory, and the RGB channels are adjusted using the lookup table, for example.

The icon processing circuit 180 generates or acquires an icon image. For example, the icon processing circuit 180 is an icon color extension circuit. A mask image for the icon is stored in the memory 195, and the icon processing circuit 180 converts the mask image into a RGB image so as to generate the icon image. The mask image is a k-bit image whose pixels each have k bits of data. k is an integer of one or more. An index color table including 2 to the power k pieces of data is stored in the memory 195, the register circuit 170, or an unshown nonvolatile memory, and the icon processing circuit 180 converts k-bit data to RGB data according to the color table. For example, when k=2, the color table is a lookup table in which 2-bit indices are respectively associated with four colors. Alternatively, when k=1, the color table is a lookup table in which 1-bit indices are respectively associated with two colors, "0" indicating a background pixel is associated with a specific color, and "1" indicating a foreground pixel is associated with another color. Another color is a specific color that is different from that of the background. The memory 195 is a RAM such as an SRAM.

The image processing circuit 135 overlays an icon image on an image (hereinafter, referred to as an input image) input from the pre-processing circuit 125 so as to make composite the icon image with the input image, and outputs the composite image to the interface 140 as a display image. The display image in this case is a rendered image. For example, the image processing circuit 135 overlays an icon image on an input image such that the icon image completely hides the background. The background, here, is the input image. Alternatively, an icon image and a background may be blended at a given blending ratio. The position at which the icon image is overlaid on the input image is set in the memory 195, the register circuit 170, or an unshown nonvolatile memory. Also, the image processing circuit 135 performs various types of image processing on an input image or a composite image in which an icon image is composited to the input image, and outputs the resultant image after the image processing as the display image. The image processing is tone conversion processing, coordinate conversion processing, color conversion processing, interpolation processing, and the like.

The interface 140 outputs the display image to a device external to the circuit device 100. The device external to the circuit device 100 is a display driver that drives a display panel, for example. For example, the interface 140 is an LVDS interface, and converts an RGB parallel signal from the image processing circuit 135 to an LVDS serial signal. The interface 140 outputs the display image along with an index, and the display driver that has received the index may perform an operation based on the index. The operation based on the index is to stop display, for example.

The interface 190 mediates communication between the circuit device 100 and processing device 200 with respect to setting information, control information, and the like. For example, the interface 190 is a serial communication interface conforming to the SPI (Serial Peripheral Interface) method, the I2C method, or the like. The setting information and control information from the processing device 200 is written into the register circuit 170, for example, and the circuit device 100 performs an operation according to the setting information and control information.

The CRC circuit 160 performs error detection on the image data that the interface 110 has received using CRC. That is, the CRC circuit 160 compares a reference CRC value that was input from the processing device 200 via the interface 190 with the CRC value calculated from the image data that the interface 110 has received, and detects whether or not these values match.

The index acquisition circuit 155 obtains, from a region of interest (ROI) of the display image, an index that indicates whether the image of the region of interest is appropriately displayed. The region of interest is a region including the icon in the display image. Specifically, the index acquisition circuit 155 obtains an index that represents a degree of dissimilarity between a foreground image corresponding to the icon image of the display image and a background image corresponding to the background, of the display image, of the foreground image, based on the pixel values of the display image. This index is a visibility index for evaluating visibility of the icon, and the details thereof will be described later. The background image is the input image or an image obtained by performing image processing on the input image, and the image of a portion of the display image excluding the foreground image. Alternatively, the index acquisition circuit 155 obtains, based on the pixel values of the display image and the pixel values of the reference image, which is a reference with respect to the foreground image, or based on the pixel values of an edge image of the display image and the pixel values of an edge image of the reference image, an index that represents the degree of matching between the foreground image corresponding to the icon image of the display image and the reference image. This index is a shape index that evaluates the similarity between the shape of the icon and a reference, and the details thereof will be described later. The reference is a mask image, for example.

The register circuit 170 is configured to be accessible from the processing device 200 via the interface 190. The register circuit 170 includes an index register 171 that stores an index obtained by the index acquisition circuit 155, and the processing circuit 200 reads out an index from the index register 171 via the interface 190. The processing circuit 200 includes an error detection circuit that performs error detection based on the index. The error detection performed on the display image through image analysis is realized by acquiring the index and performing the error detection described above. That is, whether or not an icon image is properly composited to an input image is checked through image analysis.

The image data subjected to image processing by the image processing circuit 135 is different from the image data received by the interface 110, and therefore error detection using a CRC value input from the processing device 200 cannot be performed. In the present embodiment, the visibility index and the shape index are obtained from an image subjected to image processing, the visibility of an icon and the similarity between the icon shape and a reference are evaluated, and therefore error detection can be performed based on the evaluation results. That is, an error can be determined if the visibility of the icon or the similarity between the icon shape and the reference is low.

Note that, logic circuits included in the circuit device 100 may be configured as separate circuits, or may be configured as an integrated circuit using automatic placement and routing or the like, for example. The logic circuits are the pre-processing circuit 125, the image processing circuit 135, an error detection circuit 150, the CRC circuit 160, the icon processing circuit 180, and the like, for example. Also, a portion or all of the logic circuits may be realized by a processor such as a DSP (Digital Signal Processor). In this case, programs or instruction sets in which functions of the circuits are described are stored in a memory, and the functions of the circuits are realized by the processor executing the programs or the instruction sets.

Figure 2:
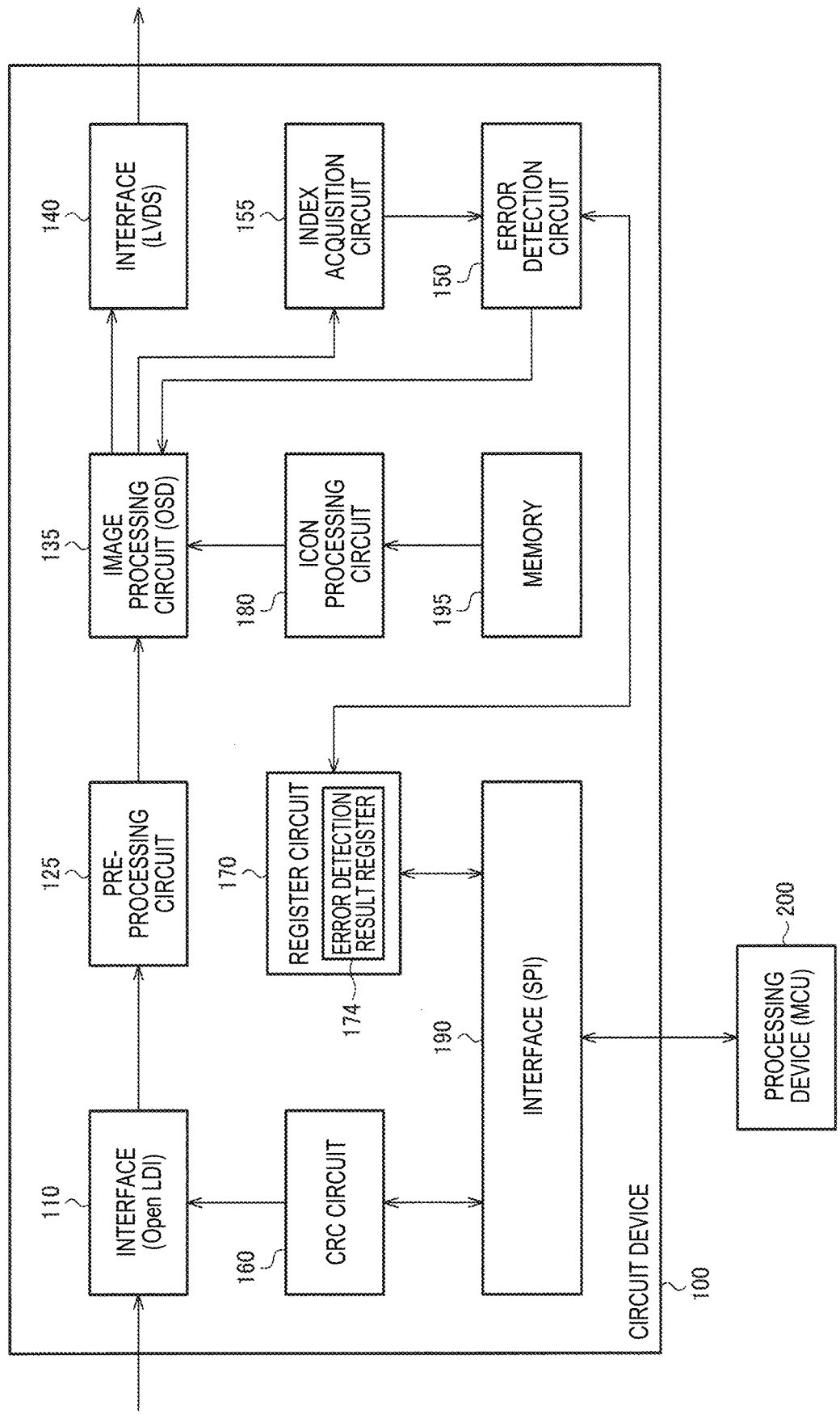
FIG. 2 shows a second exemplary configuration of the circuit device of the present embodiment.

FIG. 2 shows a second exemplary configuration of the circuit device of the present embodiment. In FIG. 2, the circuit device 100 includes the error detection circuit 150. Also, the register circuit 170 includes an error detection result register 174. Note that the constituent elements that are the same as the constituent elements that have been described in FIG. 1 will be denoted by the same reference signs, and the descriptions thereof will be omitted, as appropriate.

The index acquisition circuit 155 outputs an obtained index to the error detection circuit 150. The error detection circuit 150 performs error detection on the display image based on the index. The visibility index is a numerical value that changes according to the visibility of an icon, and the shape index is a numerical value that changes according to the similarity between an icon shape and a reference. The error detection circuit 150 performs error detection by comparing these indices with threshold values. The threshold value with respect to the visibility index is a threshold value indicating allowable visibility, and the threshold value with respect to the shape index is a threshold value indicating allowable similarity.

When the error detection circuit 150 detects an error, the image processing circuit 135 stops outputting a display image to the interface 140. Alternatively, when the error detection circuit 150 detects an error, the interface 140 stops outputting a display image. The interface 140 outputs a display image along with error information, and the display driver that has received the error information may perform an operation based on the error information. The error information is an error determination flag, an index, or the like, for example. The operation based on the error information is stopping display or the like, for example.

The register circuit 170 includes the error detection result register 174 that stores an error detection result output from the error detection circuit 150, and the processing circuit 200 reads out the error detection result from the error detection result register 174 via the interface 190. The error detection result is an error determination flag that indicates whether or not an error has been determined with respect to a display image, for example. The processing device 200 performs an operation that is to be performed at the time when an error is detected if the error detection result indicates an error. The operation that is to be performed at the time when an error is detected is to stop transmitting image data to the circuit device 100, to transmit predetermined image data to the circuit device 100, or the like, for example. The predetermined image data is image data of an image to be displayed to a user when an error is detected.

In the configuration in FIG. 2 as well, similarly to the configuration in FIG. 1, as a result of obtaining the visibility index and the shape index from an image subjected to image processing, the visibility of an icon and the similarity between an icon shape and a reference are evaluated, and an error can be detected based on the evaluation result.

A display controller that controls a display driver can be envisioned as the circuit device 100 in FIG. 1 or 2 described above. Note that the circuit device to which the method of the present embodiment can be applied is not limited to the display controller. For example, the circuit device may be a display driver that includes a function of the display controller. In the case where the circuit device is a display controller or a display driver, the circuit device is an integrated circuit device (IC), for example. Note that the circuit device may include a plurality of integrated circuit devices. For example, the circuit device includes a display controller, which is a first integrated circuit device, and a processing device, which is a second integrated circuit device. In this case, the display controller includes an index acquisition circuit that acquires an index, and the processing device includes an error detection circuit that performs error detection based on the index received from the display controller.

2. Register Circuit

Figure 3:
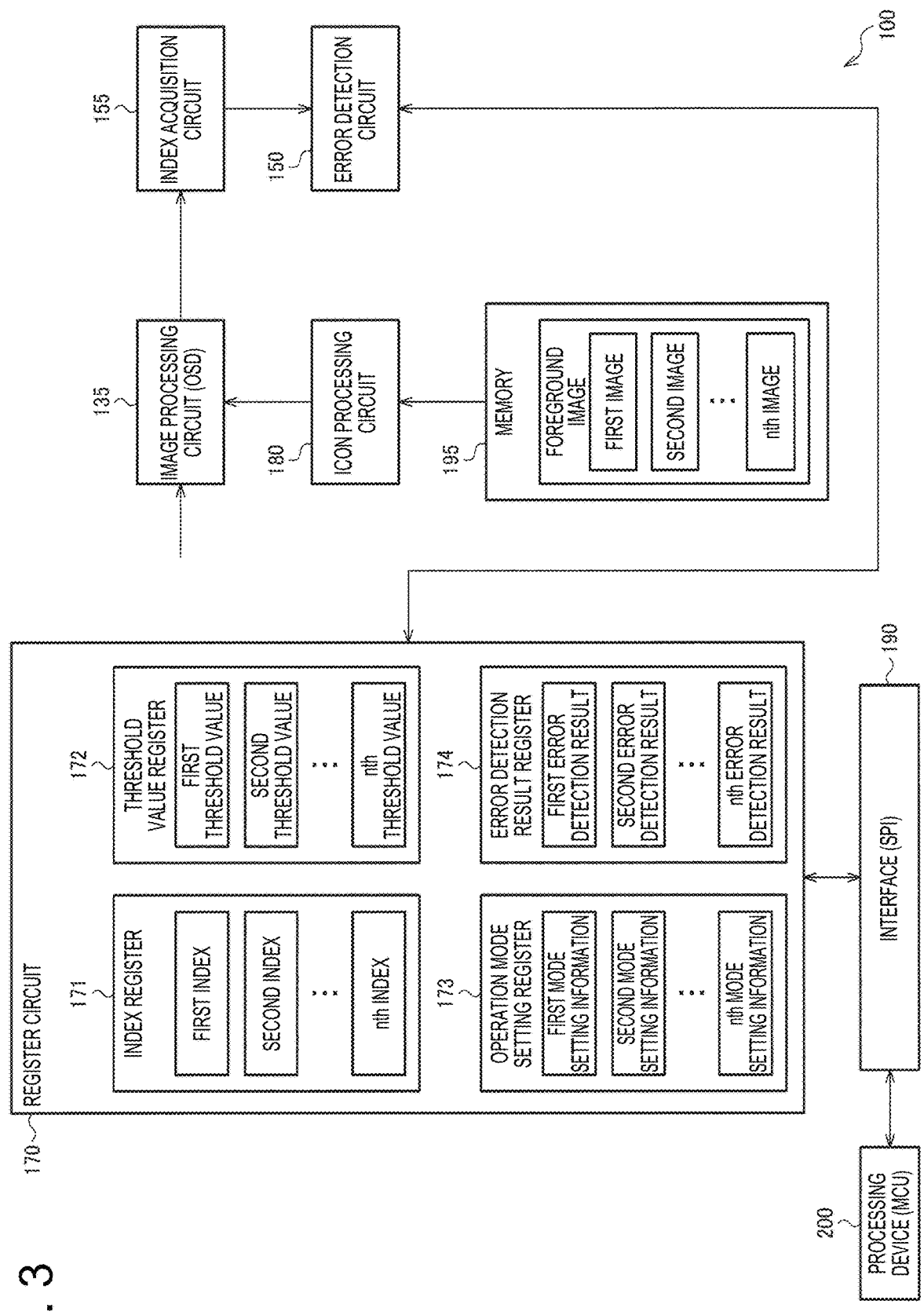
FIG. 3 shows an exemplary configuration of a register circuit when a plurality of foreground images are used.

FIG. 3 shows an exemplary configuration of a register circuit when a plurality of foreground images are used. In FIG. 3, the interface 110 and the CRC circuit 160 are not illustrated. Note that the constituent elements that are the same as the constituent elements that have been described in FIGS. 1 and 2 will be denoted by the same reference signs, and the description thereof will be omitted, as appropriate.

As shown in FIG. 3, first to $n^{th}$ images are stored in the memory 195 as the foreground images. n is an integer of two or more. The foreground image is an image whose size is smaller than that of the background image, which is an input image. The first to $n^{th}$ images are images whose shapes, sizes, and display positions relative to the background image are different to each other. In the following, a case where the first to $n^{th}$ images are each a mask image for an icon will be described as an example, but the first to $n^{th}$ images are not limited to mask images for an icon. The icon processing circuit 180 reads out one of the first to $n^{th}$ images from the memory 195, and generates an icon image using the image as the mask image for the icon. The image processing circuit 135 composites the icon image to the input image, and outputs the composite image as the display image.

Note that the display image may be generated by compositing a plurality of icon images to the input image. That is, the icon processing circuit 180 reads out a plurality of images out of the first to $n^{th}$ images from the memory 195, and generates icon images from the respective images. In this way, a plurality of icon images are generated. The image processing circuit 135 generates the display image by compositing a plurality of icon images to the input image.

The register circuit 170 includes the index register 171, a threshold value register 172, an operation mode setting register 173, and an error detection result register 174. n register values corresponding to the n foreground images are stored or set in each of the registers.

The index register 171 stores first to $n^{th}$ indices corresponding to the first to $n^{th}$ images. That is, if an icon image generated from an $i^{th}$ image is included in the display image, the index acquisition circuit 155 acquires an $i^{th}$ visibility index for evaluating the visibility of the icon, and an $i^{th}$ shape index for evaluating the similarity between the shape of the icon and a reference as the $i^{th}$ index. The index register 171 stores the $i^{th}$ index. i is an integer of one or more and n or less. Note that the index acquisition circuit 155 obtains one of the visibility index and the shape index, and the index may be stored in the register 171 as the $i^{th}$ index.

The processing device 200 sets first to $n^{th}$ threshold values corresponding to the first to $n^{th}$ images in the threshold value register 172 via the interface 190. Specifically, an $i^{th}$ visibility index threshold value and an $i^{th}$ shape index threshold value are set in the threshold value register 172 as an $i^{th}$ threshold value. The error detection circuit 150 performs error detection by comparing the $i^{th}$ index with the $i^{th}$ threshold value. That is, the error detection circuit 150 compares the $i^{th}$ visibility index with the $i^{th}$ visibility index threshold value, compares the $i^{th}$ shape index with the $i^{th}$ shape index threshold value, performs error detection based on the comparison results, and outputs the result as the $i^{th}$ error detection result. For example, if at least one of the comparison results is a result indicating an error, it is determined that an error has occurred in the display image.

The error detection result register 174 stores first to $n^{th}$ error detection results corresponding to the first to $n^{th}$ images. The $i^{th}$ error detection result indicates whether or not an error has occurred in the display image with respect to the $i^{th}$ image. The processing device 200 reads out the first to $n^{th}$ error detection results from the error detection result register 174 via the interface 190, and performs an operation based on the first to $n^{th}$ error detection results. Note that the error detection circuit 150 outputs one error detection result, and the error detection result register 174 may store the one error detection result. That is, if any of the first to $n^{th}$ error detection results indicates an error, the error detection circuit 150 outputs an error detection result indicating the error. Alternatively, if all of the first to $n^{th}$ error detection results indicate that there is no error, the error detection circuit 150 outputs an error detection result indicating that there is no error, and the error detection result register 174 may store the error detection result.

Note that in the case where the circuit device 100 acquires an index, and the processing device 200 performs error detection based on the index, the error detection result register 174 may be omitted. In this case, the processing device 200 reads out the first to $n^{th}$ indices from the index register 171 via the interface 190, and performs error detection based on the first to $n^{th}$ indices.

The processing device 200 sets first to $n^{th}$ pieces of mode setting information corresponding to the first to $n^{th}$ images to the operation mode setting register 173 via the interface 190. The $i^{th}$ piece of mode setting information is information regarding an operation mode that is set when the $i^{th}$ error detection result indicates an error, and information regarding the operation to be performed when an error is detected.

According to the above-described embodiment, the circuit device 100 includes the image acquisition circuit that acquires image data, and the index acquisition circuit 155 that obtains an index for performing error detection on the display image based on the image data. Also, the index acquisition circuit 155 obtains an index representing the degree of dissimilarity between a foreground image, which is an image in a given region of the display image, and a background image, of the display image, corresponding to the background of the foreground image based on pixel values of the display image.

The image acquisition circuit corresponds to the interface 110 in FIG. 1 or 2. Note that the image acquisition circuit needs only be a circuit that acquires image data that has not been subjected to processing by the image processing circuit 135, and is not limited to the interface 110. For example, the image acquisition circuit may be a memory access circuit that reads out image data stored in an unshown memory. Alternatively, the image acquisition circuit may be the pre-processing circuit 125 in FIGS. 1 and 2.

The display image based on image data is an image obtained by processing the image data, and is an image to be displayed in a display panel. As described above, the display image is an image in which an icon is composited to an image represented by image data, for example. Alternatively, the display image is an image obtained by performing image processing such as tone conversion processing on the image represented by image data or the image to which an icon has been composited.

An image of a given region is an icon image, for example, as described above, but is not limited thereto, and may be an image that is to be displayed in a portion of the display image. Note that, in FIGS. 1 and 2, an icon image, which is a foreground image, is composited to a background image, but there is no limitation to this. That is, the foreground image is not limited to an image that is composited to a background image, a portion of a display image that is to be an error detection target is designated as the foreground image, and an index with respect to the foreground image may be obtained.

According to the present embodiment, an index representing the degree of dissimilarity between a foreground image and a background image is obtained based on pixel values of the display image, and therefore, even in a case where a data error detection method such as CRC cannot be used, error detection can be performed on the display image. That is, even in a case where image processing is performed on image data that has been received along with a CRC value, and the image subjected to the image processing is to be displayed as the display image, the visibility of the foreground image can be evaluated using the index that represents the degree of dissimilarity between the foreground image and the background image. Accordingly, display is performed when the visibility of the foreground image is secured, and an error is determined when the visibility of the foreground image is not secured. In this way, error detection that does not use a known data error detection method such as CRC becomes possible.

Also, in the present embodiment, the image processing circuit 135 that generates a display image by performing image processing on image data is included. The index acquisition circuit 155 obtains an index based on pixel values of the display image generated by the image processing circuit 135.

As described above, the image subjected to image processing such as tone conversion processing is different from the image that the interface 110 receives, and therefore a data error detection method such as CRC cannot be applied. According to the present embodiment, as a result of obtaining an index that represents the degree of dissimilarity between a foreground image and a background image, error detection can be performed based on the index.

Also, in the present embodiment, the index acquisition circuit 155 statistically obtains an index based on pixel values of the display image.

Obtaining an index statistically is to obtain an index by performing processing using a statistical method in which a plurality of pixel values included in the display image are the population of the statistics. Specifically, a histogram is generated from the display image, and an index is obtained based on the histogram. Although a detailed description will be given later, an index is obtained by performing a correlation operation on a histogram generated from the display image and a histogram generated from the foreground image, for example. Alternatively, an index is obtained by performing determination processing on binary included in a histogram generated from the display image.

According to the present embodiment, as a result of statistically obtaining an index based on pixel values of the display image, an index representing the degree of dissimilarity between a foreground image and a background image can be obtained. That is, instead of detecting a defect in data as in a case of using CRC, the degree of dissimilarity between the foreground image and the background image is evaluated using a statistical method, and whether or not an error is determined is determined based on the degree of dissimilarity.

Also, in the present embodiment, the circuit device 100 includes the image acquisition circuit that acquires image data, the image processing circuit 135 that performs image processing on the image data so as to generate the display image, and the index acquisition circuit 155 that obtains an index for performing error detection on the display image. The index acquisition circuit 155 obtains an index representing the degree of matching between the foreground image, which is an image of a given region of the display image, and a reference image, based on the pixel values of the display image and the pixel values of the reference image, which is a reference with respect to the foreground image, or based on the pixel values of an edge image of the display image and the pixel values of an edge image of the reference image.

The reference image is an image that is expected to be displayed as the foreground image in the display image, and has the same shape as the foreground image. When the degree of matching between the foreground image and the reference image is high, the degree of matching between the shape of the foreground image and the shape of the reference image can be determined to be high. According to the present embodiment, display is performed when the degree of matching between the foreground image and the reference image is high, and an error can be determined when the degree of matching between the foreground image and the reference image is low. In this way, error detection that does not use a known data error detection method such as CRC becomes possible.

Also, in the present embodiment, the circuit device 100 includes the index register 171 that stores indices.

As a result of storing indices obtained by the index acquisition circuit 155 into the index register 171, an index can be acquired from the index register 171 via an interface. For example, the processing device 200 that is external to the circuit device 100 can acquire an index from the index register 171 via the interface 190. Accordingly, the processing device 200 or the like that has acquired an index can perform error detection on the display image based on the index.

Also, in the present embodiment, the circuit device 100 includes the error detection circuit 150 that performs error detection on the display image based on an index.

In this way, the error detection circuit 150 incorporated in the circuit device 100 can perform error detection on the display image. Also, the circuit device 100 can perform an operation that is to be performed at the time when an error has been detected based on the error detection result. Alternatively, the error detection result is output to the processing device 200 and the like, and the processing device 200 and the like can perform an operation that is to be performed at the time when an error has been detected based on the error detection result.

Also, in the present embodiment, the error detection circuit 150 performs error detection by comparing a threshold value for determining an error in the display image with an index.

In the data error detection method using CRC, whether or not an error has occurred in the image data is detected by comparing a CRC value received along with the image data and a CRC value computed from the received image data. On the other hand, the index in the present embodiment is not only an index that simply indicates whether or not there is an error, but is also an index whose value changes according to the degree of dissimilarity between the foreground image and the background image or the degree of matching between the foreground image and the reference image. As a result of comparing the index with a threshold value, error detection can be performed even in a case where a data error detection method such as CRC cannot be used. That is, an error can be determined when it is determined that visibility cannot be secured based on the degree of dissimilarity, or when it is determined that the similarity of the shapes cannot be secured based on the degree of matching.

Also, in the present embodiment, the threshold value register 172 in which threshold values are set is included.

In this way, a threshold value to be compared with an index can be set to the threshold value register 172 via an interface. For example, the processing device 200 can set a threshold value to the threshold value register 172 via the interface 190. As a result of setting the threshold value such that the value thereof can be changed, the degree of visibility or the degree of similarity between shapes at which an error is determined can be changed. As a result of providing the threshold value register 172, a user can freely set the threshold value, which is an error determination criterion, for example. The user is an operator that manufactures an electronic apparatus such as an on-board meter panel, and a business operator that manufactures an automobile that includes such an electronic apparatus.

Also, in the present embodiment, the circuit device 100 includes the memory 195 into which first to $n^{th}$ images are stored as the foreground image. First to $n^{th}$ threshold values corresponding to the first to $n^{th}$ images are set in the threshold value register 172, as threshold values for determining an error in the display image. The error detection circuit 150 performs error detection, when performing the error detection on the display image including the $i^{th}$ image as the foreground image, using the $i^{th}$ threshold value.

In this way, the threshold value to be compared with an index can be set for each image to be displayed as the foreground image. Accordingly, the allowable degree of visibility and similarity of shapes can be changed for each image to be displayed as the foreground image. For example, in the case where the foreground image is an icon image, a threshold value with which an error can be easily determined is set with respect to an icon that is not desired to be displayed when the icon is not discernible, and a threshold value with which an error cannot not be easily determined can be set with respect to an icon for which it is desirable to recognize that something is displayed even if the icon is not discernible.

Also, in the present embodiment, the operation mode setting register 173 in which the operation mode of the circuit device 100 when an error is determined in the display image by the error detection circuit 150 is set is included.

In this way, the operation mode of the circuit device 100 when an error is determined in the display image can be set to the operation mode setting register 173 via an interface. For example, the processing device 200 can set an operation mode to the operation mode setting register 173 via the interface 190. For example, the circuit device 100 can be caused to perform the operation desired by the user when an error is detected.

Also, in the present embodiment, a mode of reporting the result of error detection to an external device external to the circuit device 100, a mode of not displaying the display image, and a mode of displaying a specific image as the display image are set as operation modes in the operation mode setting register 173.

The result of error detection is information indicating whether or not an error has been detected, information indicating for which of the first to $n^{th}$ images an error has been detected, and the like, for example. The external device is the processing device 200, for example, which is an SoC, a CPU, or the like. The result of error detection is output to the external device via the interface 190, for example. The display image being not displayed is to set a display panel to a state in which an image is not displayed, and is to cause the display panel to display black or white over the entire display region, for example. The specific image is an image that is different from the display image, which is the target of the error detection, and is an image desired to be displayed when an error is detected. For example, the specific image is an image in which a message, a symbol, a color, or the like that is desired to be presented to the user when an error is detected is displayed, for example. In the case of color, a predetermined color such as red is displayed in the entirety of or a portion of the display region of the display panel, for example.

In this way, the operation mode of the circuit device 100 when an error has been determined in the display image can be set to one of the above-described three modes. For example, the circuit device 100 can be caused to execute one of the above-described three modes, as the operation desired by the user when an error is detected.

Also, in the present embodiment, first to $n^{th}$ operation modes corresponding to the first to $n^{th}$ images are set to the operation mode setting register 173. The $i^{th}$ operation mode is the operation mode of the circuit device 100 when an error is detected in the display image by the error detection circuit 150, in the case where the error detection circuit 150 has performed error detection on a display image that includes the $i^{th}$ image as the foreground image.

In this way, the operation to be performed when an error is detected can be set for each image that is to be displayed as the foreground image. For example, in the case of the foreground image being an icon image, what type of operation is to be performed when an error is detected in the display of the icon can be set according to the type of icon.

Note that a case where circuits of the circuit device 100 execute the functions of the invention has been described above, but the functions of the invention may be implemented as an error detection method described below.

That is, in the error detection method, image data is acquired, and an index that represents the degree of dissimilarity between a foreground image, which is an image in a given region of a display image that is based on the image data, and a background image corresponding to the background, of the display image, of the foreground image may be acquired based on the pixel values of the display image as an index for performing error detection on the display image. Also, in the error detection method, image data is acquired, a display image is generated by performing image processing on the image data, and an index that represents the degree of matching between a foreground image, which is an image of a given region of the display image, and a reference image may be obtained as an index for performing error detection on the display image based on pixel values of the display image and pixel values of the reference image, which is a reference with respect to the foreground image, or pixel values of an edge image of the display image and pixel values of an edge image of the reference image.

3. Index Acquisition Processing and Error Detection Processing

In the following, index acquisition processing to be performed by the index acquisition circuit 155 and error detection processing to be performed by the error detection circuit 150 will be described.

In an image processing system in which content is displayed in a display, there are cases where whether or not a predetermined region in an image matches the initially intended region needs to be confirmed. For example, a case where an important image is displayed in a cluster display of an automobile system is considered. The cluster display is a meter panel display. Here, there are cases where a predetermined piece of important information needs to be displayed via a visible image overlaid on existing content displayed in a screen. In the following, various methods for detecting whether or not an image is properly displayed will be described. The detection is performed by analyzing a region of interest (ROI), and deriving some important indices that indicate the degree of properness in displaying the region.

In the following, a method and concept in which a display image is verified relative to a reference will be used. This is achieved by computing a matching degree of the display image relative to the reference image. In the following, a case in which the region of interest (ROI) in a display image is considered will be described, but the method can be easily extended so as to be applied to the entirety of an image by setting the ROI to the boundary of the entire image. In the following, an example in which an algorithm of the method of the invention is applied to a color image will be described, but the method of the invention can be applied to a grey scale image or a binary image as well. The binary image is also referred to as a black-and-white image.

Figure 4:
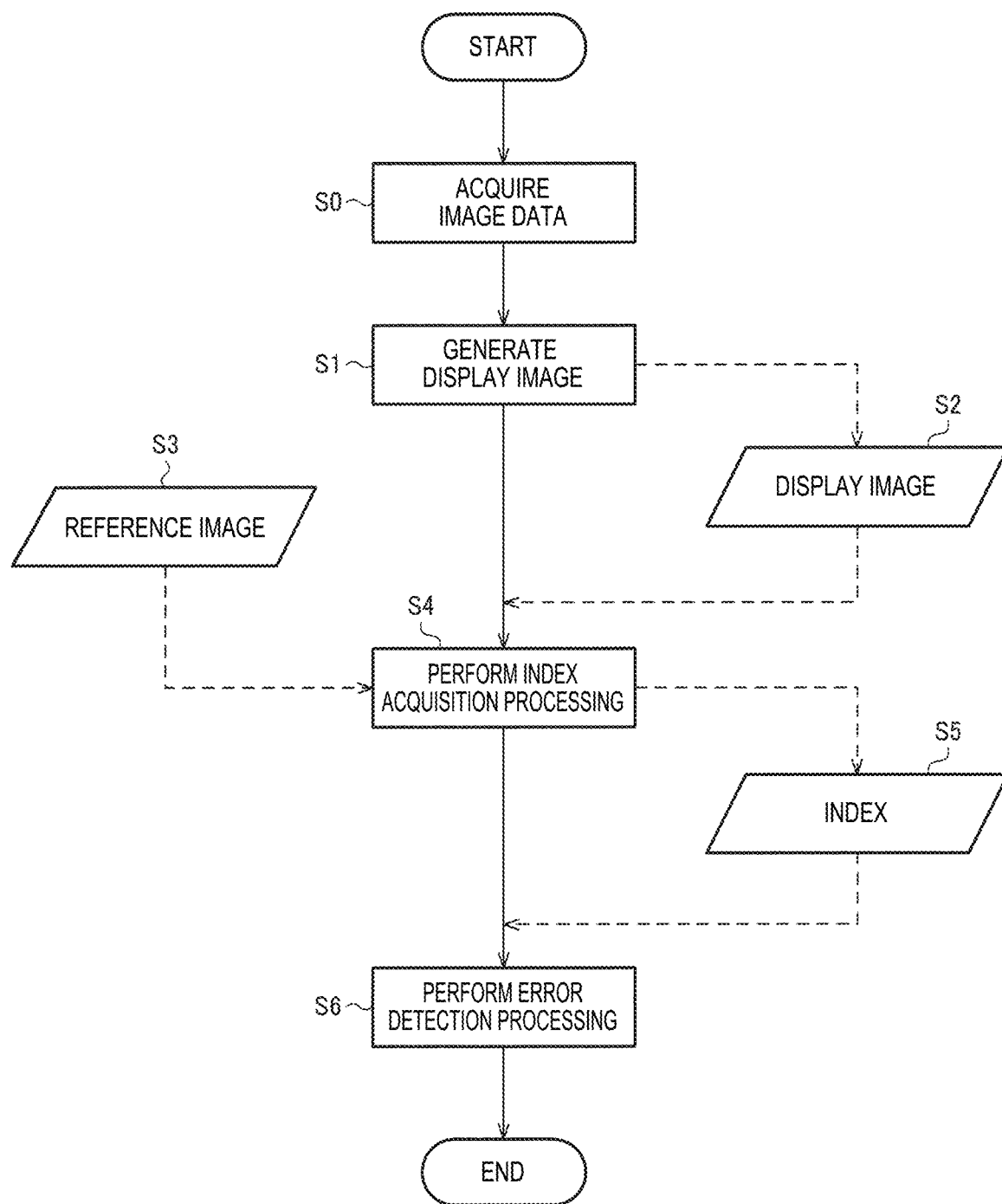
FIG. 4 is a flowchart illustrating a processing flow of error detection processing.

FIG. 4 is a flowchart illustrating a processing flow of error detection processing. In the error detection processing, image data is acquired (S0). Hereinafter, the image represented by the image data is referred to as an input image. Next, a display image is obtained by overlaying an icon image on the input image (S1, S2). Next, error detection processing is performed (S4) by comparing a reference image (S3) and the display image (S2) so as to obtain an index (S5). Note that the reference image is not necessarily acquired. For example, there are cases where, when a visibility index is obtained, the index is calculated using only a display image without using a reference image. Next, error detection is performed (S6) by comparing the index with a threshold value.

In index acquisition processing and error detection processing, the validity of the display image or a portion of the display image is confirmed by comparing the display image with a reference image. In the above comparison, a color shift, a change in luminance, and a change due to scaling or a predetermined intentional image conversion are not detected as an error, and an important error such as a deformation caused by an unintentional rotation, or an error or the like caused by cropping or noise that makes it impossible for a user to recognize the image is detected.

In order to do so, two indices, namely a visibility index and a shape index are used. The visibility index is a numerical value that is prescribed so as to represent the degree of visibility, that is, the degree according to which an image of a region of interest can be recognized without blending into the background. Note that the region of interest can be defined so as to include the entirety of an image.

As described above, the index acquisition processing and the error detection processing are applied to a color image. Note that the index acquisition processing and the error detection processing can also be applied to a black-and-white or grey scale image by using one channel for grey or using only two values in one channel for a binary image. In order to do so, pixels of a region of interest in a display image are converted from an RGB format to a YCbCr format. Note that the method of the invention can be applied to another color space as well. The other color space is Lab, Hsv, or the like.

3.1. First Computation Method for Obtaining Visibility Index (First Index)

Figure 5:
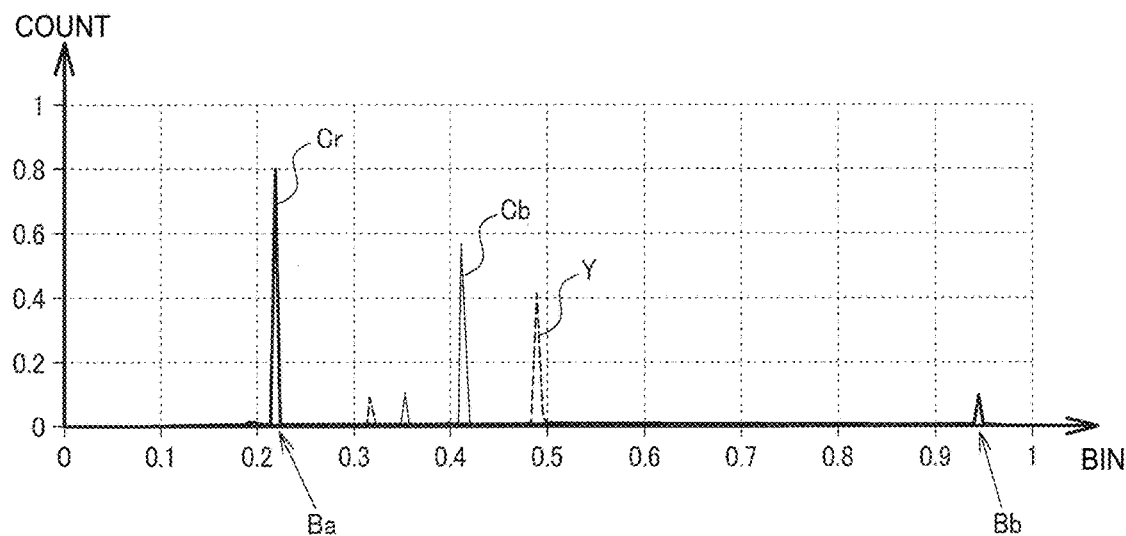
FIG. 5 shows a histogram of YCbCr channels in a region of interest.
Figure 6:
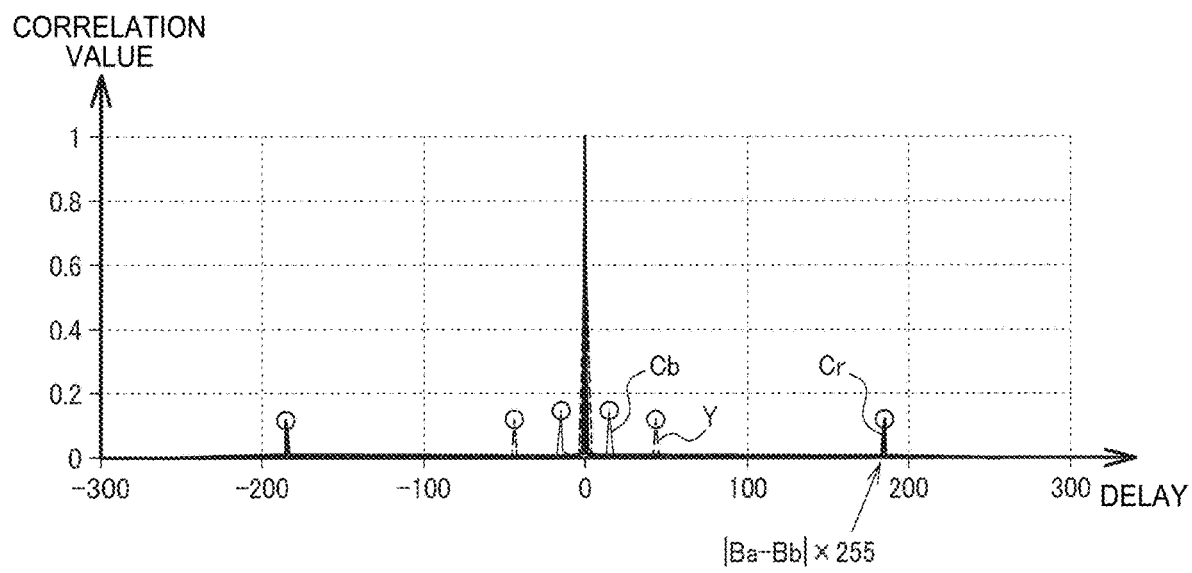
FIG. 6 shows self-correlation values obtained by performing a self-correlation operation on the histogram.

FIG. 5 shows a histogram of YCbCr channels in a region of interest. Also, FIG. 6 shows self-correlation values obtained by performing a self-correlation operation on the histogram.

As shown in FIG. 5, a histogram is obtained for each channel of a YCbCr image using n binaries. For example, 256 binaries are used, and a histogram that includes a set of different binaries can be generated.

The histogram is generated by counting the number of occurrences of a specific value in a region of interest. That is, for each of the channels of a YCbCr image, the number of pixels that have a value indicated by each binary is counted in the region of interest. Next, the histogram is normalized to have a value from 0 to a. The value "a" can be selected considering ease of in implementation. For example, a can be set to one, 255, or the like. In FIG. 5, a=1. Next, a cross-correlation operation is performed on the histogram for each channel with itself. That is, a self-correlation operation is performed on the histogram. Then, a resultant self-correlation signal is used in an analysis thereafter. As shown in FIG. 6, the self-correlation signal is normalized such that the peak value at zero delay is one or a pre-set value.

The self-correlation value can be obtained using the following Equation (1). f and g represent functions on which correlation operation is performed, and f=g in the case of self-correlation. The signal to be input as a function is the histogram, here. f*g represents the correlation operation between the function f and the function g. f* represents a complex conjugate of the function f, and f*=f in the present embodiment. m represents the number of binaries in the histogram. n represents a delay (lag), and n is an integer from −255 to +255, in FIG. 6.

[Math 1]

$$(f * g)[n] = \sum_{m=-\infty}^{\infty} f^*[m] g[m+n] \quad (1)$$

Note that, 256 binaries are normalized to values from 0 to 1 in the histogram in FIG. 5, and therefore the horizontal axis shows a value from 0 to 1. The correlation values in FIG. 6 are obtained by changing the delay by one binary, and therefore the horizontal axis shows values from −(256−1) to +(256−1).

As shown in FIG. 6, when a two-color image exists in the region of interest, sidebands are obtained through the self-correlation operation. The distance of the delay from the center at which the above-described peak occurs indicates the contrast between colors. The center corresponds to zero delay. Because the human eye can distinguish features of an image through a contrast, the peaks of all the three channels need to be checked. The contrast is a luminance contrast or color contrast, for example. In FIG. 6, the Y channel is indicated by broken lines, the Cb channel is indicated by thin solid lines, and the Cr channel is indicated by thick solid lines. The checking is performed by setting a threshold value for a peak search such that noise in the self-correlation signal is not picked up. For example, the minimum peak threshold is set to 0.05. The local maximum value is obtained by searching for the peak in the signal. The peak to be searched for is a peak having a peak value that is larger than the threshold value.

Note that the minimum distance between successive peaks can be set to a predetermined value in order to evade an in-band signal peak. These threshold values are adjustable values and appropriate values are selected according to the application.

In order to obtain a first index that indicates whether or not a distinguishable image is displayed on a background having two or more colors, all of the peaks in the self-correlation signal exceeding a noise threshold value are obtained with respect to all of the channels, and thereafter, the maximum distance at which a peak occurs, that is, the maximum delay is obtained. The maximum value of the delays at which peaks occur in three channels is selected as the index that indicates visibility.

In a correlation plot shown in FIG. 6, peaks are indicated with circles. In the illustrated example, the Cr channel shows the maximum separation, and the distance is 184. This value is normalized to a conceivable maximum delay. For example, the conceivable maximum delay is 256, which is the number of binaries in the histogram. Therefore, the index value is 184/255=0.722. In an image shown in FIG. 7, this index value is shown as a Vis parameter. This computation is illustrated with respect to one example.

Figure 7:
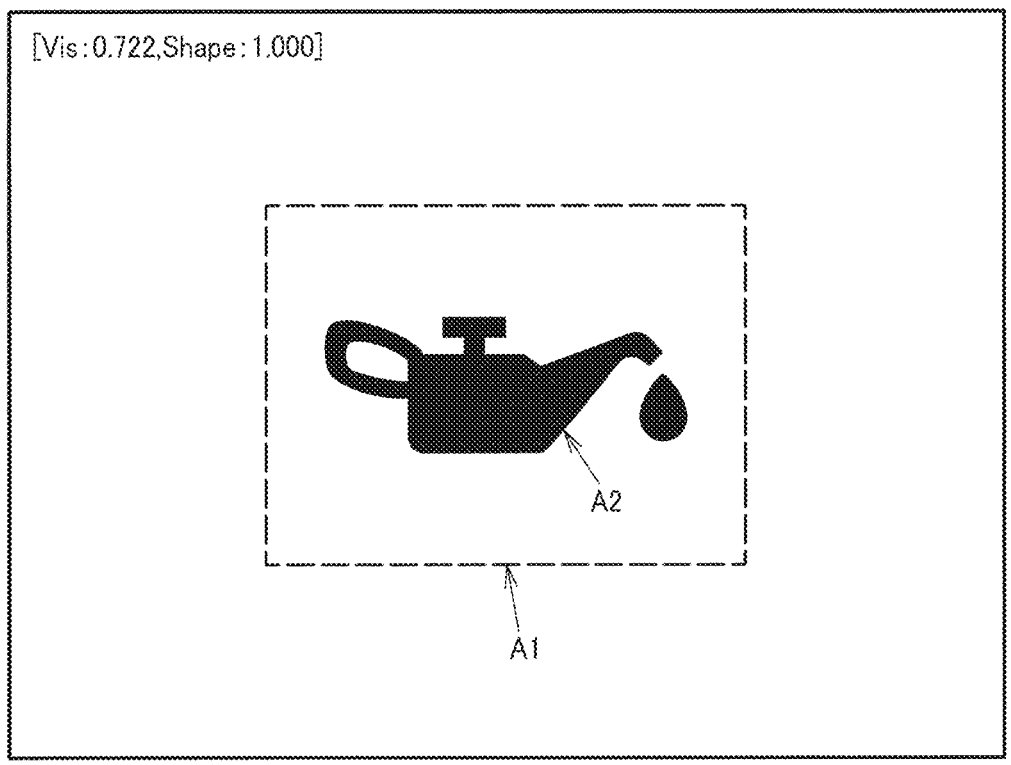
FIG. 7 shows a first example of a display image.

FIG. 7 shows a first example of the display image. Because the display image is an image to be analyzed, the display image is also referred to as an analysis image. A1 indicates the region of interest, and A2 indicates an icon. Note that the broken line that shows the region of interest is not actually rendered in the display image. For example, the inside of the icon A2 that is a portion illustrated by black in FIG. 7 is red, and the background that is a portion illustrated by white in FIG. 7 is green.

In the image in FIG. 7, there are two pixel groups, namely a red pixel group and a green pixel group, in the region of interest, and therefore, in the histogram shown in FIG. 5, two peaks, one of which is large and the other is small, occur for each YCbCr channel. For example, in the Cr channel, peaks occur at binaries Ba and Bb. The distance between the two peaks represents the contrast between the color of a foreground icon, which is the icon, and the color of the background, and the larger the distance, the larger the difference between the colors of the foreground and the background. The distance between two peaks in the histogram is the distance of the delay at which a peak occurs in the self-correlation values shown in FIG. 6. Since the foreground icon, which is the icon, is red and the background is green, in the image in FIG. 7, the distance between two peaks with respect to the Cr channel is the largest distance in the histogram shown in FIG. 5, and the distance is |Ba−Bb|× 255. This is detected as the maximum distance at which a peak occurs in the self-correlation value shown in FIG. 6, and the normalized index value is |Ba−Bb|. Accordingly, the larger the contrast between the color of the foreground icon, which is the icon, and the color of the background, the larger the visibility index value.

The error detection circuit 150 performs error detection based on the visibility index obtained as described above. For example, the visibility index is compared with a given threshold value, and if the visibility index is smaller than the given threshold value, an error is determined. Alternatively, the visibility index may be output to a device external to the circuit device 100 as the error detection result.

3.2. Second to Fourth Computation Methods of Obtaining Visibility Index

In a second computation method, the visibility index is obtained using a cross-correlation operation.

In the first computation method, the reference visibility inside a region of interest is checked using a self-correlation operation. The reference image in this case does not include information regarding a color or the like of the background image. Therefore, only a composite image, which is the display image, is analyzed to check whether or not the composite image includes two or more colors.

In the second computation method, a case where the reference image includes total information, that is, a source image is changed by performing display processing, for example, is envisioned. In this case, a histogram of the reference image is generated using a method similar to the method of generating the histogram of an analysis image, and a cross-correlation operation between histogram signals of the reference image and the analysis image can be performed instead of the self-correlation operation. Mathematically, the self-correlation operation is a cross-correlation operation performed on the signal itself. Therefore, the cross-correlation operation or the self-correlation operation can be performed by merely changing the signal to be input to the correlation operation. That is, in Equation (1), the histogram of the reference image is one of the functions f and g, and the histogram of the display image is the other of the functions f and g.

In the case of the cross-correlation operation, whether or not there is a peak having a height that exceeds a predetermined threshold value in a cross-correlation signal is checked instead of obtaining the distance of the peak from the central point. If there is such a peak, the analysis image matches the reference image to a substantial degree, as long as the pixel distribution is considered. Accordingly, error detection at a first level can be performed on the analysis image. This parameter does not indicate spatial correlation, and indicates only pixel distribution correlation. The index in this case is not the distance of a peak from the central point in the case of the self-correlation operation, and may be the peak value itself.

Figure 8:
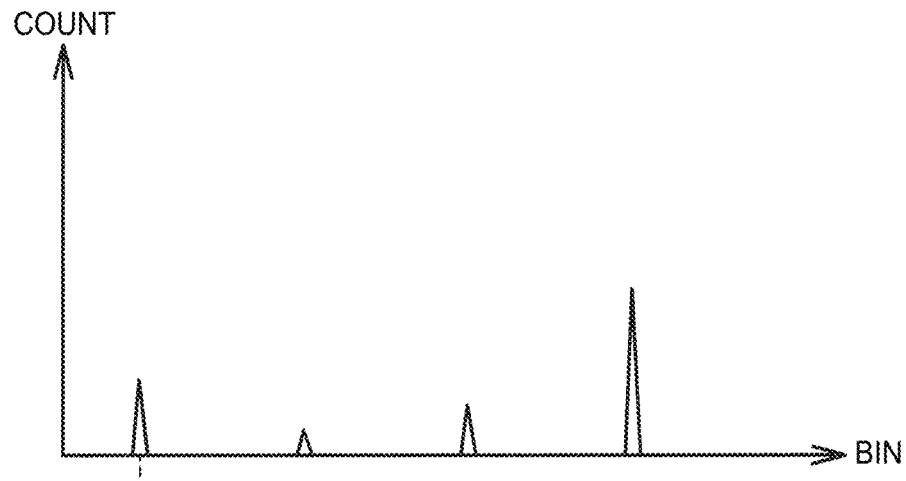
FIG. 8 shows an example of a histogram when the foreground is in multi-tone.
Figure 8:
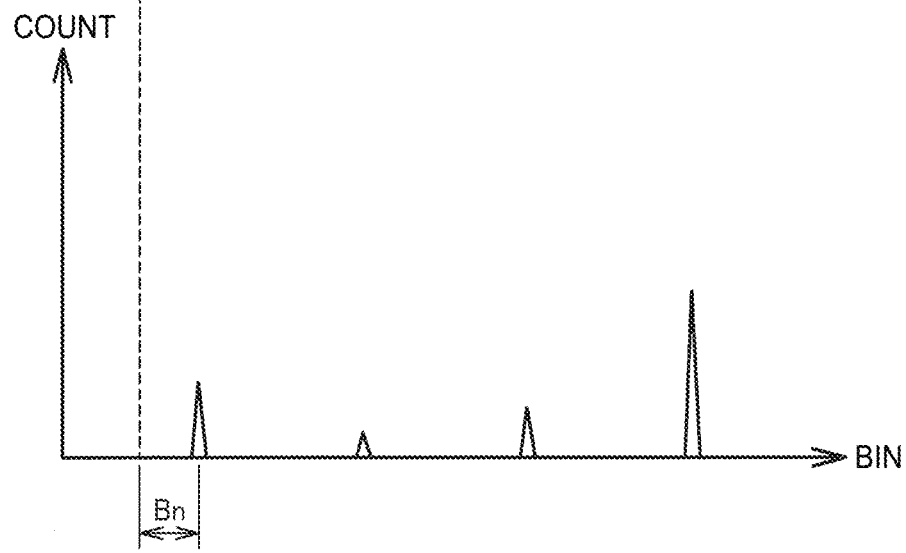
Figure 9:
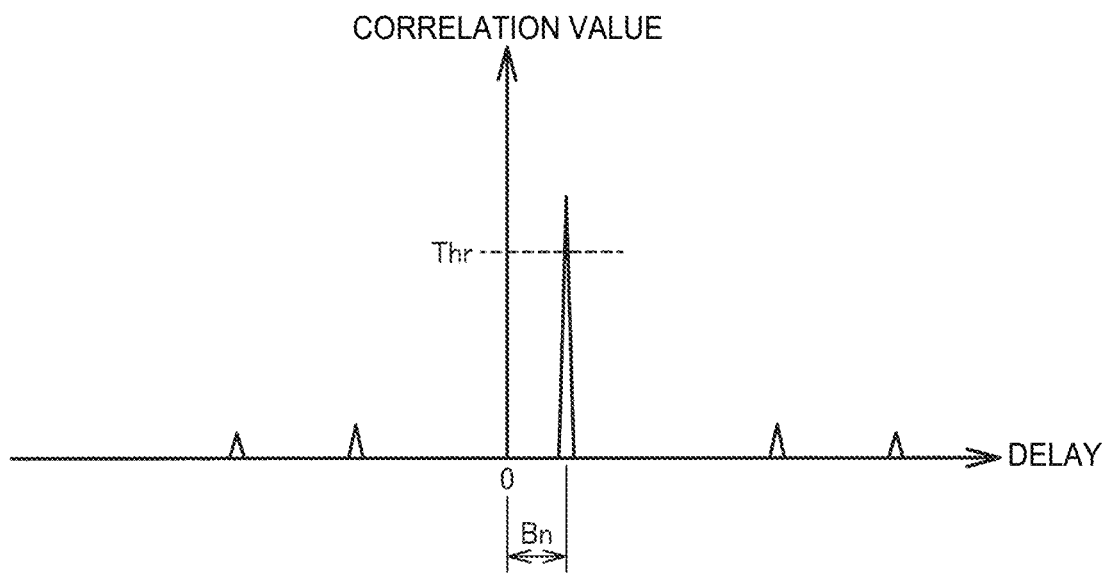
FIG. 9 shows an example of cross-correlation values of a histogram when the foreground is in multi-tone.

FIG. 8 shows an example of a histogram when the foreground such as an icon is multi-tone having two or more colors. FIG. 9 shows an example of the cross-correlation values of the histogram in FIG. 8. Here, a description will be given with respect to one channel of a color image, but similar processing is performed on a plurality of channels. For example, the maximum peak value of peaks in the cross-correlation values with respect to the plurality of channels may be adopted.

As shown in FIG. 8, three or more peaks occur in the histogram of the display image, which is a composite image, and the reference image. In the example in FIG. 8, there are four peaks. Assume that the peaks in the histogram of the display image shifts from the peaks in the histogram of the reference image by Bn. In this case, as shown in FIG. 9, a large peak appears at a delay Bn in the cross-correlation value. If the peak value of this peak is larger than a threshold value Thr, the peak value is adopted as the visibility index value, for example.

In a third computation method, a ratio of contrast between the foreground and the background is obtained as the visibility index value.

In the first computation method, the difference |Ba−Bb| between binaries Ba and Bb at which peaks occur in the histogram of the Cr channel is used as the visibility index value.

In the third computation method, a contrast ratio |Ba−Bb|/Ba or |Ba−Bb|/Bb is obtained, and the contrast ratio is used as the visibility index value. Alternatively, in the case of using a reference image such as the case of the second computation method, C1=|Ba−Bb| in the display image, and C2=|Ba−Bb| in the reference image are obtained, a contrast ratio C1/C2 or C2/C1 is obtained, and the contrast ratio is used as the visibility index value.

In a fourth computation method, a multi-dimensional histogram is generated so as to obtain the visibility index.

In the first computation method one-dimensional histogram for each channel is used to analyze the visibility.

In the fourth computation method, a multi-dimensional histogram is generated from signals of a plurality of channels, and a multi-dimensional correlation operation is performed on the multi-dimensional histogram so as to obtain the visibility index. The multi-dimensional correlation operation is a multi-dimensional self-correlation operation or a multi-dimensional cross-correlation operation. Accordingly, it is possible to favorably simulate contrast detection by human eyes. There are cases where more favorable performance can be obtained by using a 3D color histogram.

According to the above-described embodiment, the circuit device 100 includes the image processing circuit 135 that acquires a display image, and the error detection circuit 150 that performs error detection on the display image. Also, the index acquisition circuit 155 obtains a histogram (FIG. 5) of pixel values (each of YCbCr channels) of the display image, and performs a correlation operation using the histogram (FIG. 6). The index acquisition circuit 155 obtains an index (visibility index, first index) that represents the degree of dissimilarity between a foreground image, which is an image of a given region of the display image, and a background image, of the display image, corresponding to the background of the foreground image based on a result of a correlation operation. The error detection circuit 150 performs error detection based on the index.

In this way, error detection, which is not bit-wise error detection such as CRC, can be performed on the display image based on the index that represents the degree of dissimilarity between the foreground image and background image of the display image. When the dissimilarity degree of the foreground image relative to the background image is high, the likelihood that the foreground image will be visually distinguished from the background image is high, and the visibility of the foreground image is considered to be high. That is, according to the present method, an error can be determined when the visibility of the foreground image is low. For example, an icon or the like for warning a user is displayed in an on-board meter panel or the like. According to the present embodiment, the display of such an icon is not stopped due to a one-bit error or the like, and the icon is displayed as much as possible to warn the user while the visibility of the icon is secured.

Here, in FIGS. 1 and 2, the image processing circuit 135 is an OSD, but there is no limitation thereto, and the image processing circuit 135 needs only be a circuit for acquiring an arbitrary display image. A detailed description will be given in "4. Modifications". Also, the display image is an image generated or the like to be displayed in a display (display device). In the above-described embodiment, the display image is an image rendered by the OSD, but there is no limitation thereto, and may be an image generated by performing some image processing, an image received through communication, an image read out from a memory, or the like.

Also, the error detection is to output an error detection result based on the index, and is to determine whether or not there is an error in the display image based on the index, for example. Alternatively, the error detection may be to output the index as an error detection result. For example, the value of the index increases as the degree of dissimilarity between the foreground image and the background image increases. In this case, it is determined that the display image includes an error if the index is less than a given value.

Also, the foreground image is an image of a region, of the display image, with respect to which the degree of dissimilarity from the background image is determined by the index. Also, the region is a given region. For example, a mask image for designating the foreground is prepared. For example, the mask image is stored in the memory 195 or the like. The pixels in the foreground image, which are the pixels in the given region, are specified using pixels that define the foreground in the mask image. For example, pixels in the foreground image are specified by pixels having a value of "1" in a 1-bit mask, for example. More specifically, the position on the display image to which the mask image that defines the foreground is designated, and the foreground is specified by the position and the mask image. For example, the position at which an icon is overlaid is designated, and the foreground is specified by the position and the mask image.

Also, the background image is an image of a portion or the entirety of the display image excluding the foreground image. That is, a region of interest, which is a region including the foreground image, is set to a portion or the entirety of the display image, and the image of a region of the region of interest excluding the foreground image is the background image. For example, the pixels of the background image are specified by the pixels that define the background in the mask image. The pixels that define the background are pixels having a value "0" in the 1-bit mask, for example.

Also, the degree of dissimilarity is a degree of dissimilarity in each component that is a constituent component in a color space. A constituent component is also referred to as a channel. For example in the YCbCr space, the degree of dissimilarity represents the degree of difference between the luminance of the foreground image and the luminance of the background image, or the degree of difference between the color of the foreground image and the color of the background image. Alternatively, in the RGB space, the degree of dissimilarity represents the degree of difference between the color of the foreground image and the color of the background image.

Also, in the present embodiment, the index acquisition circuit 155 obtains histograms of the respective constituent components in the color space (FIG. 5), performs a self-correlation operation on each of the histograms of the constituent components, obtains distances at which self-correlation peaks occur with respect to the respective components (FIG. 6), and obtains an index based on the maximum distance of the obtained distances. The maximum distance is |Ba−Bb| in FIG. 6, and the index here is the visibility index.

In this way, the index can be obtained using the component having the maximum difference between the foreground image and the background image, of the constituent components in the color space. The component having the maximum difference between the foreground image and the background image is considered to be a component that is visually recognized to have a large difference, and therefore, as a result of obtaining the index using the component, the degree of dissimilarity between the background and the foreground can be evaluated. Also, the visibility of the foreground can be appropriately evaluated using this index.

Here, the index needs only be a value obtained based on the maximum distance |Ba−Bb|. For example, in the first computation method, the index is the maximum distance |Ba−Bb| itself. Also, in the second computation method, the index is a contrast ratio based on the maximum distance |Ba−Bb|. The contrast ratio is |Ba−Bb|/Ba or the like, for example.

Also, in the present embodiment, the index acquisition circuit 155 obtains first histograms of respective constituent components in the color space from the display image as histograms, and obtains second histograms of the respective components from a reference image corresponding to the foreground image (FIG. 8). The index acquisition circuit 155 performs a cross-correlation operation on the first histogram and the second histogram for each component, and obtains the index based on the peak value of the cross-correlation peak (FIG. 9).

In this way, even if the reference image is in multiple tones including two or more colors, the index representing the degree of dissimilarity between the foreground image and the background image can be obtained. That is, although two or more peaks occur in the histogram of the reference image, if the same pattern as this histogram is included in the histogram of the display image, it can be determined that an image similar to the reference image, in at least a color or luminance pattern, is included in the display image. In this case, a large peak is to occur in a result of cross-correlation operation, and thus the visibility of the foreground can be appropriately evaluated by obtaining the index from the peak value.

Here, the reference image is an image corresponding to the foreground image when the foreground image is properly displayed in the display image. More specifically, the reference image is an image that is the same as the foreground image at least with respect to the peak pattern in the histogram. Here, the relative positional relationship of the peaks needs only be the same, as shown in FIG. 8, and the pattern may be shifted as a whole.

Also, in the present embodiment, the index acquisition circuit 155 obtains a second index (shape index) that represents the degree of matching between the foreground image and the reference image based on pixel values of the display image and pixel values of the reference image, which is the reference with respect to the foreground image, or based on edges in the display image and edges in the reference image. The error detection circuit 150 performs error detection based on the first index (visibility index) and the second index (shape index).

In this way, error detection can be performed on the display image by combining two indices that are obtained by evaluating properties that are different from each other. That is, as a result of combining an index that represents the degree of dissimilarity, in luminance or color, between the foreground image and the reference image, and the second index that represents the degree of matching, in shape, between the foreground image and the reference image, highly accurate error detection can be performed on the display image. Note that the details of the second index (shape index) will be described later.

Also, in the present embodiment, the image processing circuit 135 generates a display image by overlaying a second image on a given region of a first image. The background image is an image corresponding to the first image, of the display image.

In this way, the display image can be generated by overlaying an icon, a character, or the like on the input image by the OSD. In this case, the character or icon corresponds to the foreground image, and a portion of the original input image other than this corresponds to the background image.

In the present embodiment, as a result of performing such error detection on the display image, an error can be determined when an icon or a character has not been properly overlaid (that is, is visually recognizable to a user) in an OSD. On the other hand, even if a processing error has occurred to a degree of one bit in overlaying, an error is not determined if the visibility is secured, and therefore an icon or a character can be displayed to a user.

Also, the present embodiment can be implemented as a following error detection method as well. That is, in this method, a histogram of pixel values of the display image is obtained, a correlation operation is performed using the histogram, an index representing the degree of dissimilarity between a foreground image, which is an image in a given region of the display image, and a background image, of the display image, corresponding to the background of the foreground image is obtained based on the result of correlation operation, and error detection is performed on the display image based on the index.

Also, the present embodiment can be implemented as a following error detection method. That is, in this method, a region of interest in the display image is analyzed, and an index that describes the visibility of the foreground relative to the background is computed. Here, a reference image may be used as a mask in order to specify the foreground. The index can be computed by using a following technique (a) or (b). (a) The separation between the foreground and the background is searched for using a histogram of the display image. (b) The contrast ratio between the foreground and the background is calculated.

3.3. First Computation Method of Shape Index (Second Index)

The shape index is an index that indicates whether or not the shape of a region of interest in the display image, which is an analysis image, matches that of the reference image. In the following, the computation method of the shape index will be described.

First, pixel blocks in the ROI of the analysis image are averaged such that the size of the ultimate averaged image is m×n pixels. This subsampling processing is performed such that a small number of pixel errors are not detected as an important error, and the entire shapes of the reference image and the analysis image are confirmed while ignoring these errors. The errors desired to be ignored are color shift, slight distortion, and the like. In order to obtain a complete match, the resolution of the image obtained through subsampling can be increased. The value m×n can be selected according to the application. As will be described later, when used in relation to the reference image, the value m×n is selected based on sample data observation.

When the region of interest of the analysis image includes u×v pixels, the averaging block size is u/m×v/n pixels. When reference background information cannot be used, pixels of a portion of the analysis image in which reference pixels do not exist are deleted. This operation corresponds to reference foreground masking. This is performed because it is necessary that the baseline with respect to background pixels is matched (aligned, put under the same condition) between the reference image and the analysis image. The baseline being matched means being aligned or being put under the same conditions. Therefore, the values of the background pixels are set to the same value both in the analysis image and the reference image.

Figure 10:
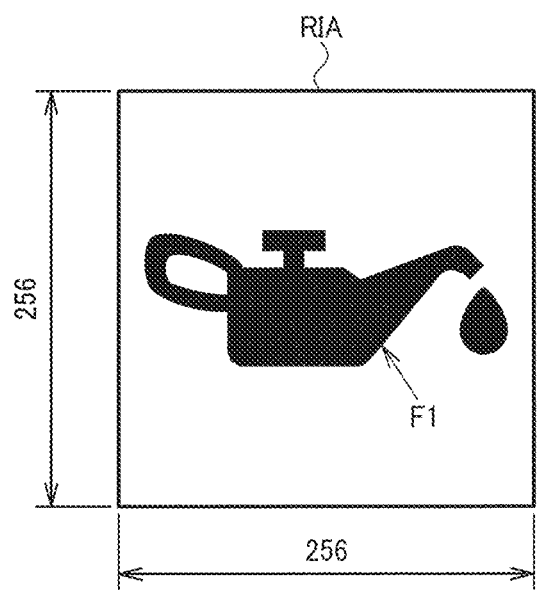
FIG. 10 shows an example of a reference image.
Figure 11:
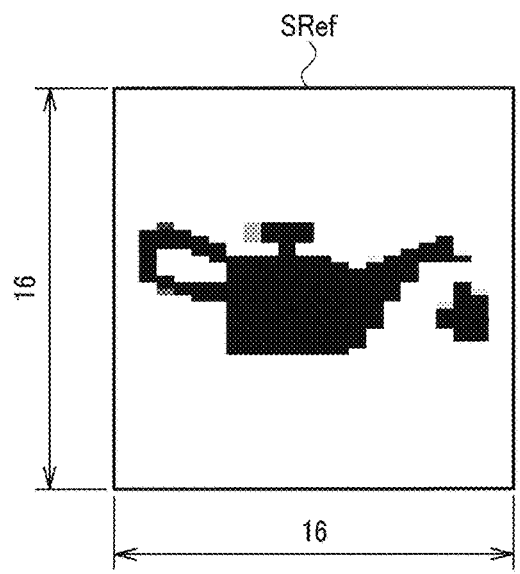
FIG. 11 shows an averaged image of the reference image.

The reference image is also averaged so as to have a size of m×n pixels. Averaging is performed separately on each of the channels. FIG. 10 shows an example of the reference image. A foreground F1, which is an icon of a reference image RIA is colored, and a background, which is a region other than the icon, is not colored, that is black, for example. In FIG. 10, the size of the reference image RIA is 256×256 pixels. FIG. 11 shows an averaged image of the reference image. In FIG. 11, m=n=16, and the size of an averaged image SRef is 16×16 pixels. Since the backgrounds of the reference image and its averaged image are not colored, the background of a region of interest of the analysis image is made colorless, and an averaged image of the image of the region of interest is obtained. For example, the background is made colorless by deleting the background.

Next, the averaged image (SRef m×n) of the reference image and the averaged image (SAnz m×n) of the region of interest of the analysis image are compared pixel by pixel using a distance reference, and a distance D is obtained using Equation (2). The distance D is a three-dimensional distance. In the present embodiment, the distance reference is a square of Cartesian distance, but a similar parameter can be obtained with another distance reference.

[Math 2]

$$D = \sum_{c=1}^{3} \sum_{y=1}^{n} \sum_{x=1}^{m} ([R_{xyc} - R'_c] - [A_{xyc} - A'_c])^2 \quad (2)$$

c represents the channel, x represents the pixel position in the averaged image in a lateral direction, and y represents the pixel position in the averaged image in a longitudinal direction. The lateral direction is also referred to as a horizontal direction, and the longitudinal direction is also referred to as a vertical direction. m and n represent the size of the averaged image. $R_{xyc}$ represents the pixel value at a position (x, y) in the averaged image of the reference image in the channel c. $R'_c$ represents an average value of $R_{xy}$ pixels in the channel c. The average value of the $R_{xy}$ pixels is obtained by averaging the $R_{xyc}$ values inside the averaged image. $A_{xyc}$ represents the pixel value at a position (x, y) in the averaged image of the analysis image in the channel c. $A'_c$ represents an average value of $A_{xy}$ pixels in the channel c. The average value of the $A_{xy}$ pixels is obtained by averaging the $A_{xyc}$ inside the averaged image.

The reason why the average value is subtracted in each channel is to make a small color shift between the reference image and the analysis image to not be treated as an error. When complete matching is required, the average value can be set to 0. In this case, matching of the shape and color is checked using the distance reference.

The display image, which is an analysis image, is an image shown in FIG. 7, for example. The region of interest A1 is extracted at a periphery of a region in which the reference image is composited to an input image. In FIG. 7, the region of interest is shown by a broken line quadrangle.

The shape index S is derived from the distance parameter using the following Equations (3) and (4). The shape index S is also referred to as a shape parameter. T is a threshold value, and can adopt any value. If D<T, T/D=1, the shape index S does not change.

[Math 3]

$$S = f\left(\frac{T}{D}\right) \quad (3)$$

[Math 4]

$$D = T \text{ if } D < T \quad (4)$$

The function f is selected so as to be easily implemented by hardware. For example, the function f may be a scaling function K that scales a range from 0 to 1 to a range from 0 to k, for example. In an example described below, the function f is a unit function. That is, S=T/D. The shape index S represents the degree of matching of the shape between the reference image and the analysis image. When the images do not match, this value decreases, and has tendency to become 0. This example will be described in the following.

In FIG. 7, the icon, which is the reference image, is properly displayed in the analysis image. In this case, the shape index S=1, and Shape: 1.000 are illustrated in FIG. 7.

Figure 12:
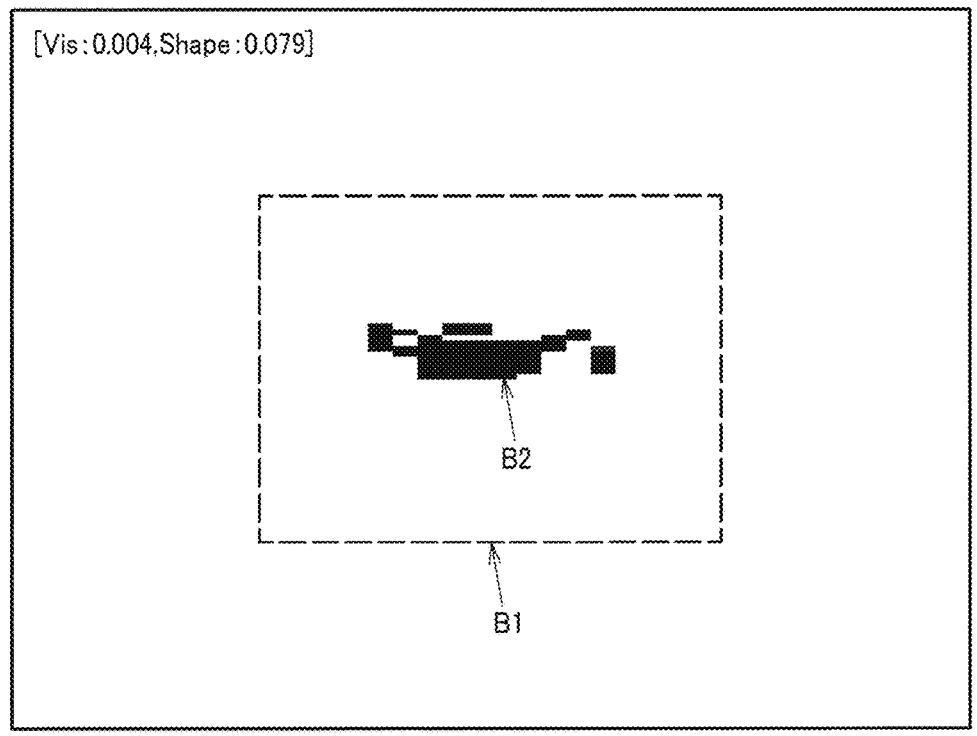
FIG. 12 shows a second example of the display image.

FIG. 12 shows a second example of the display image. B1 indicates the region of interest. As indicated by B2 in FIG. 12, the icon, which is the reference image, is not clear in the analysis image. That is, some of the reference pixels do not exist in the analysis image, and if the function f is a unit function, the shape index S takes a value of less than one. In the case of such an unclear foreground, both the visibility index and the shape index take a small value.

Figure 13:
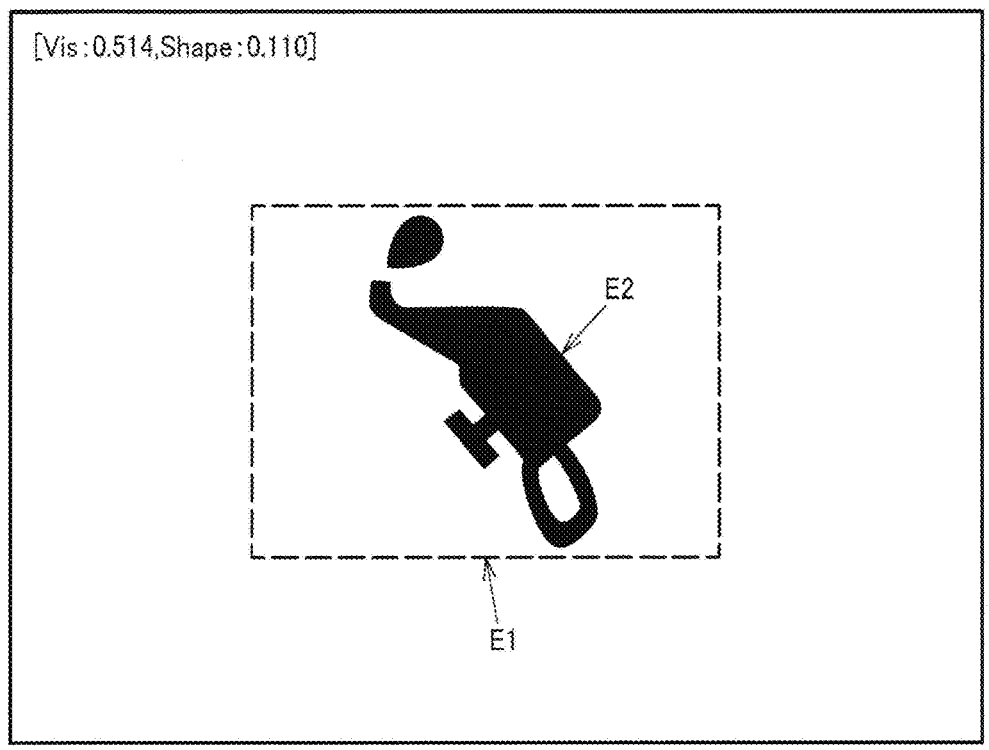
FIG. 13 shows a third example of the display image.

FIG. 13 is a third example of the display image. E1 indicates the region of interest. As indicated by E2 in FIG. 13, the icon, which is the reference image is rotated in the analysis image. In this example, since the shape is rotated from the reference, if the function f is a unit function, the shape index S takes a value of less than one. When the foreground is rotated in this way, the visibility index takes a relatively large value, and the shape index takes a small value. By combining the visibility index and the shape index in this way, appropriate error detection can be performed in various foreground states, and the accuracy of the error detection can be improved.

Note that a case where the analysis image and the reference image are available as images has been described, but the target to which the invention can be applied is not limited thereto. For example, the same computation can be easily performed in the case where the image is streamed as a line, a pixel, or a sub-image as well.

The above-described shape index only checks matching in the base signal. In the case of an image whose visibility is low, after generating a first-order gradient image by convoluting an edge detection kernel with the region of interest of the analysis image and the reference image, parameters can be obtained using a shape computation algorithm. The edge detection kernel is Laplacian, Sobel, or the like, for example. Using the obtained parameters, an error in detection that has occurred based on the shape index can be excluded. In this way, even in a case of an image having low visibility, a proper error detection result can be obtained.

3.4. Second Computation Method of Shape Index

Figure 14:
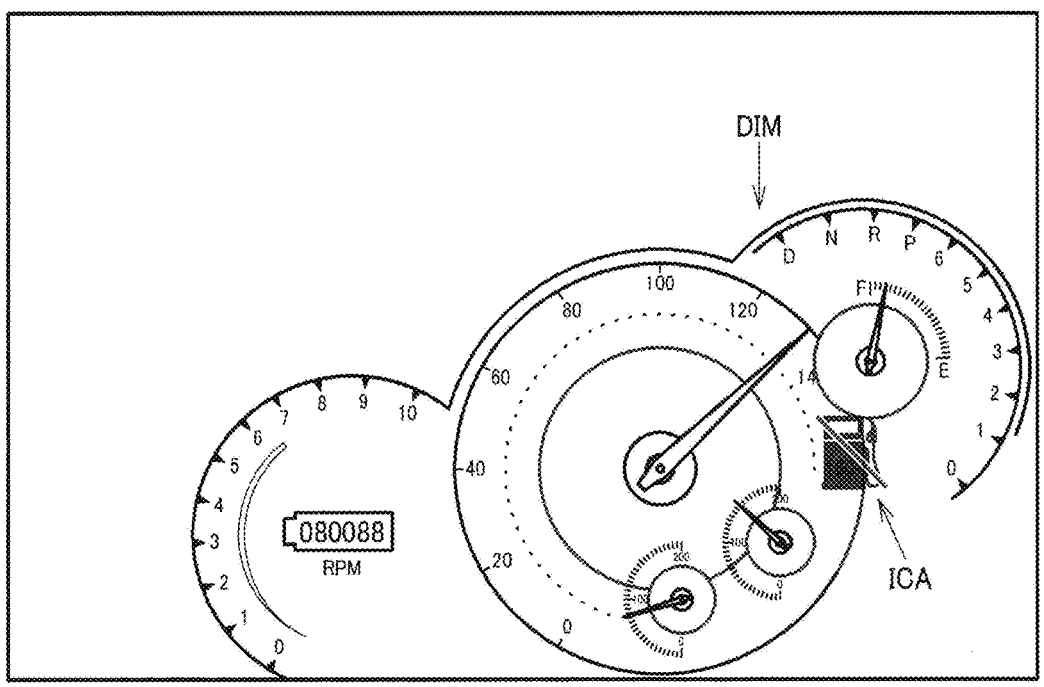
FIG. 14 shows a fourth example of the display image.
Figure 15:
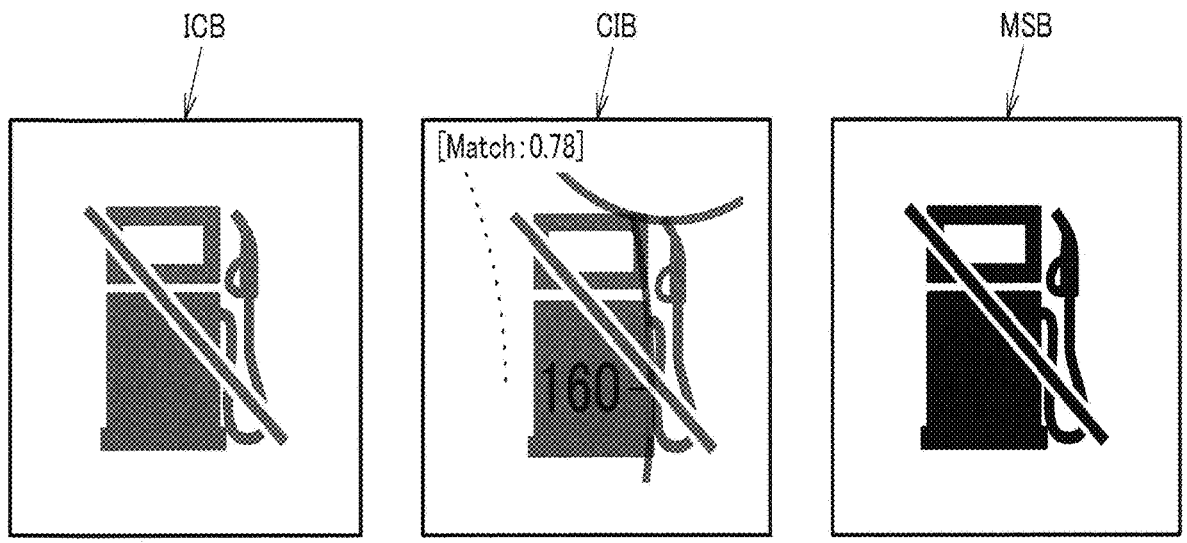
FIG. 15 shows a first example of a reference image, a display image (region of interest), and a mask image.

FIG. 14 shows a fourth example of the display image. In FIG. 14, an example in which an icon ICA is overlaid on a dashboard image DIM is shown. The foreground and background of the icon image are separately alpha-blended with the dashboard image. In the above case, while the foreground of the icon image is partially blended, the background of the icon image is completely blended. Here, the foreground of the icon image is an icon portion of the icon image. In FIG. 15, the icon portion is constituted by pixels corresponding to bit "1" in a mask image MSB, and is a portion shown by black. The background of the icon image is a portion other than the icon in the icon image. In FIG. 15, the portion other than the icon is constituted by pixels corresponding to bit "0" in the mask image MSB, and is a portion shown by white. In the background of the icon image, the icon image and the dashboard image DIM are blended at a ratio of 0:1. In the foreground of the icon image, the icon image and the dashboard image DIM are blended at a ratio of $\alpha:(1-\alpha)$, where $0<\alpha<1$. The icon blended at a ratio of $\alpha$ is the foreground in the display image, and the other regions are the background in the display image.

In the present embodiment, the relationship between this icon and the original icon is analyzed, and whether the icon is properly displayed is checked. Specifically, edges are detected in the region of interest similarly to the reference using an edge detection technique. The edge detection technique is an edge detection technique that uses a Sobel edge detection convolution operator, for example.

FIG. 15 shows a first example of the reference image, the region of interest of a display image, and the mask image. The mask image MSB is a mask that indicates the foreground and the background of the reference image ICB, a black portion indicates foreground pixels, and a white portion indicates background pixels. The reference image ICB, which is the reference icon, is an image in which the foreground, which is the icon indicated by a grey portion in the diagram, is colored. The display image CIB, which is a display icon, is an image of the region of interest in which the reference image ICB is blended into the dashboard image DIM. As a result of blending, the dashboard image DIM can be seen through the icon in the icon portion.

Figure 16:
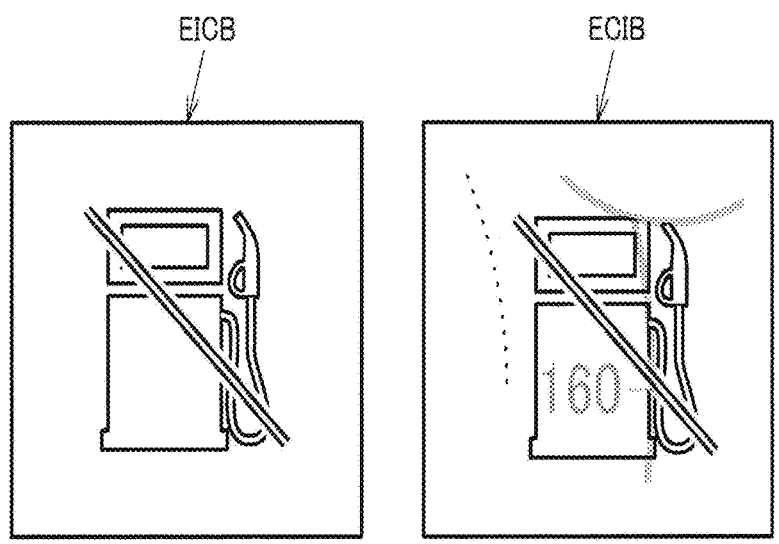
FIG. 16 shows an example of edge values calculated from the reference image and display image of the first example.

FIG. 16 shows an example of edge values calculated from the reference image and the display image. EICB indicates an edge image of the reference image ICB, and ECIB indicates an edge image of the display image CIB. For the sake of illustration, edges are shown by black lines and grey lines, but the strength of an edge can be shown in grey scale in actuality. A white portion indicates an edge at high intensity, and a black portion indicates no edge. This edge detection is performed on a luminance channel. Similarly, the edge detection is performed on a color channel or in a color space such as YCbCr as well.

Edges in the foreground region and a background region are calculated with respect to the reference image and the display image, and the shape index is calculated by calculating a similarity amount as shown in the following Equations (5) to (16). Match in the following Equation (16) is the shape index. The shape index is also referred to as a conformity value. In the following, it is assumed that the reference image has a size of m×n pixels, and the region of interest of the display image has the size of m×n pixels as well.

The following Equation (5) is a horizontal Sobel kernel, which is a Sobel filter operator for detecting edges in a horizontal direction. The following Equation (6) is a vertical Sobel kernel, which is a Sobel filter operator for detecting edges in a vertical direction.

[Math 5]

$$F_H = \begin{bmatrix} 1 & 0 & -1 \\ 2 & 0 & -2 \\ 1 & 0 & -1 \end{bmatrix} \quad (5)$$

[Math 6]

$$F_V = \begin{bmatrix} 1 & 2 & 1 \\ 0 & 0 & 0 \\ -1 & -2 & -1 \end{bmatrix} \quad (6)$$

As shown in the following Equations (7) to (12), an edge value is calculated at each pixel position in the reference image and the region of interest of the display image. "*" is a convolution operator. N is a normalization factor for keeping values in a region from 0 to 1, and N=4, here. IRef is a luminance (Y) channel of the reference image. IRef$_{(x, y)}$ is a pixel at the position (x, y) in the luminance channel of the reference image. x is an integer that satisfies 0≤x≤m, and y is an inter that satisfies 0≤y≤n. IRen is a luminance channel of the display image in the region of interest. IRen$_{(x, y)}$ indicates 3×3 pixels that are centered at a position (x, y) in the luminance channel of the display image in the region of interest.

[Math 7]

$$E1_{(x,y)} = \frac{\begin{bmatrix} E1_H \\ E1_V \end{bmatrix}_{(x,y)}}{N} \quad (7)$$

[Math 8]

$$E1_{H(x,y)} = F_H * IRef_{(x,y)} \quad (8)$$

[Math 9]

$$E1_{V(x,y)} = F_V * IRef_{(x,y)} \quad (9)$$

[Math 10]

$$E2_{(x,y)} = \frac{\begin{bmatrix} E2_H \\ E2_V \end{bmatrix}_{(x,y)}}{N} \quad (10)$$

[Math 11]

$$E2_{H(x,y)} = F_H * IRen_{(x,y)} \quad (11)$$

[Math 12]

$$E2_{V(x,y)} = F_V * IRen_{(x,y)} \quad (12)$$

As shown in the following Equations (13) to (16), the shape index Match (conformity value) is obtained from the above-described edge values. "•" represents an inner product operator.

[Math 13]

$$S = \sum_{y=0}^{n} \sum_{x=0}^{m} E1_{(x,y)} \cdot E2_{(x,y)} \quad (13)$$

[Math 14]

$$T1 = \sum_{y=0}^{n} \sum_{x=0}^{m} E1_{(x,y)} \cdot E1_{(x,y)} \quad (14)$$

[Math 15]

$$T2 = \sum_{y=0}^{n} \sum_{x=0}^{m} E2_{(x,y)} \cdot E2_{(x,y)} \quad (15)$$

[Math 16]

$$Match = \frac{S}{(T1 + T2)/2} \quad (16)$$

When the above-described computations are applied to FIGS. 15 and 16, Match=0.78 is obtained.

In the case where the conformity value is required to be calculated without analyzing the background, calculations shown in the following Equations (17) to (22) are used.

[Math 17]

$$E1_{(x,y)}^f = E1_{(x,y)} M_{(x,y)} \quad (17)$$

[Math 18]

$$E2_{(x,y)}^f = E2_{(x,y)} M_{(x,y)} \quad (18)$$

[Math 19]

$$S^f = \sum_{y=0}^{n} \sum_{x=0}^{m} E1_{(x,y)}^f \cdot E2_{(x,y)}^f \quad (19)$$

[Math 20]

$$T1^f = \sum_{y=0}^{n} \sum_{x=0}^{m} E1_{(x,y)}^f \cdot E1_{(x,y)}^f \quad (20)$$

[Math 21]

$$T2^f = \sum_{y=0}^{n} \sum_{x=0}^{m} E2_{(x,y)}^f \cdot E2_{(x,y)}^f \quad (21)$$

[Math 22]

$$Match = \frac{S^f}{(T1^f + T2^f)/2} \quad (22)$$

$M_{(x, y)}$ represents a mask pixel that defines which of the pixels belong to the background, and which of the pixels belong to the foreground. This mask can be realized by a simple 1-bit mask in which a background is defined by 0, and a foreground is defined by 1. Alternatively, the mask may be a mask of one bit or more that supports edges that are anti-aliased. In this mask, a value between 0 and 1 is handled to indicate a combination of a partial background and a partial foreground. For example, a value of 0.25 ("01" in 2-bit notation) indicates a combination of 25% of foreground and 75% of background.

Figure 17:
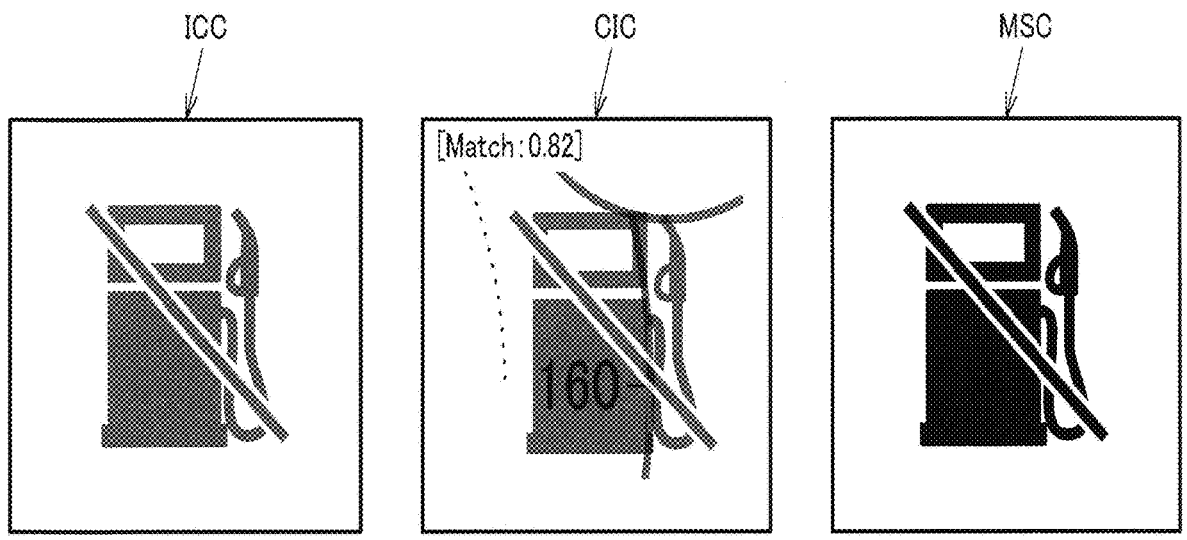
FIG. 17 shows a second example of the reference image, the display image (region of interest), and the mask image.
Figure 18:
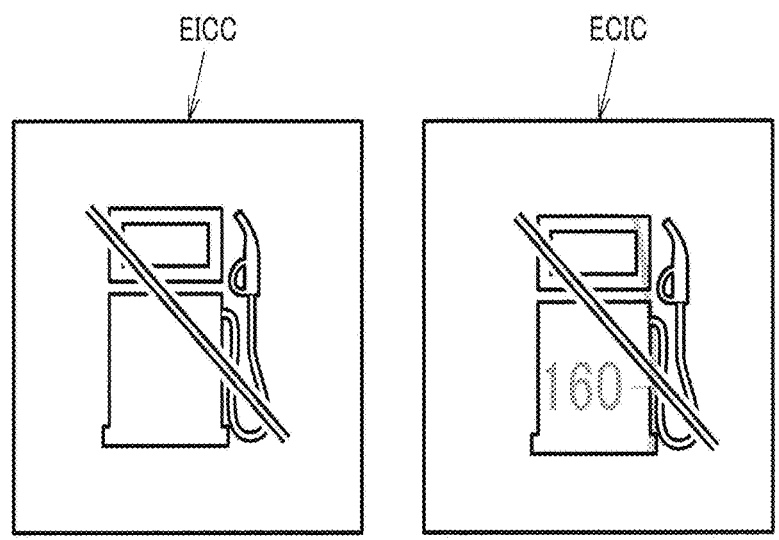
FIG. 18 shows an example of edge values calculated from the reference image and display image of the second example.

FIG. 17 shows a second example of the reference image, the display image (region of interest), and the mask image. A reference image ICC, a display image CIC, and a mask image MSC are the same as the reference image ICB, the display image CIB, and the mask image MSB in FIG. 15. FIG. 18 shows an example of edge values calculated from the reference image and the display image. EICC indicates an edge image of the reference image ICC, and ECIC indicates an edge image of the display image CIC. In the edge image ECIC of the display image, edge components that are outside the icon (background) are masked by $M_{(x, y)}$.

As shown in FIG. 17, the shape index Match increases to 0.82 in the above computation.

According to the embodiment described above, the index acquisition circuit 155 obtains an index that represents the degree of matching between the foreground image, which is an image of a given region of the display image, and the reference image, based on the pixel values of the display image and the pixel values of the reference image, which is a reference with respect to the foreground image, or based on the pixel values of an edge image of the display image and the pixel values of an edge image of the reference image. The pixel values of the edge image each represent an edge amount. The index that represents the degree of matching with the reference image is the shape index. The error detection circuit 150 performs error detection on the display image based on the index.

In this way, error detection can be performed on a display image based on the index that represents the degree of matching between a foreground image of the display image and a reference image, without performing bit-wise error detection such as CRC. If the degree of matching between the foreground image and the reference image is high, it is highly likely that the shape of the foreground image will be seen as the same shape as the reference image. That is, according to the present method, it is possible that an error is determined when the shape of a foreground image is not properly displayed. For example, an icon and the like for warning a user are displayed in an on-board meter panel or the like, for example. According to the present embodiment, the display of such an icon is not stopped due to a one-bit error or the like, and warning to a user can be performed by displaying the icon as much as possible, as long as the shape of the icon can be properly recognized.

Here, the first computation method shown by the above Equations (3) to (5) corresponds to a case where the index (S) is obtained based on the pixel values of a display image and the pixel values of a reference image, which is the reference with respect to the foreground image. Also, the second computation method shown by the above Equations (5) to (22) corresponds to a case where the index (Match) is obtained based on the pixel values of an edge image of the display image and the pixel values of an edge image of the reference image. The pixel value of an edge image corresponds to an edge amount in the above Equations (7), (10), (17), and (18).

Also, the degree of matching refers to a matching degree of the shape of an icon, a character, a figure, a mark, or the like (hereinafter referred to as icon or the like), for example. More specifically, the degree of matching refers to a matching degree with respect to the outline and the orientation of an icon or the like. Also, furthermore, the degree of matching may include a matching degree of the state of the inside of the outline of an icon or the like, that is, the state as to whether or not the inside of an outline is filled or the like, for example. For example, the index representing the degree of matching has a larger value as the degree of matching between the foreground image and the background image increases.

Also, in the present embodiment, the index acquisition circuit 155 performs subsampling for decreasing the number of pixels or the resolution of a display image and a reference image (FIG. 11). The index acquisition circuit 155 obtains distance information (Equation (2)) that represents the distance in a color space between the pixel values of the display image that has been subjected to subsampling and the pixel values of the reference image that has been subjected to subsampling, and the index (Equations (3) and (4)) is obtained from the distance information.

As a result of performing subsampling, pixel values are averaged, and therefore the influence of noise such as a one-bit error or the like can be reduced when the index is obtained. That is, the influence of a minute error that does not affect the shape can be reduced. Also, the distance between pixel values of the display image and pixel values of the reference image in the color space is to be small when the shapes match. Accordingly, as a result of using a distance in the color space, the matching degree of shapes can be appropriately evaluated.

Also, in the present embodiment, as shown in the above Equations (3) and (4), the index acquisition circuit 155 obtains the index (S) from a value obtained by dividing a given threshold value (T) by the distance information (D).

Since the higher the matching degree of the shapes is, the smaller the distance (D) is, the index (S) whose value increases as the matching degree of the shapes increases can be obtained by dividing the given threshold value by the distance information.

Also, in the present embodiment, the index acquisition circuit 155 performs a sum-of-product operation (Equation (13)) of the pixel values of an edge image of the display image and the pixel values of an edge image of the reference image, and obtains the index from the result of the sum-of-product operation (Equation (16)).

The edge image is an image in which the pixel value of each pixel represents an edge amount. In the case where the shapes match, if the edge image of the display image is compared with the edge image of the reference image with respect to the same pixel, the edge amounts must be the same (approximately the same). Conversely, in the case where the shapes do not match, the positions of edges are different between the display image and the reference image, therefore, even if there is a large edge amount in the edge image of the display image, there are cases where the edge amount of the same pixel in the edge image of the reference image is zero, for example. Therefore, when a product of edge amounts of the same pixel is obtained, and then the sum of products is calculated, if the shapes match, the sum of products takes a large value, and if the shapes do not match, the sum of products takes a small value. Accordingly, as a result of using a sum-of-products operation of edge amounts, the matching degree of shapes can be appropriately evaluated.

Here, in the above Equation (13), the "product" of the sum of products is an inner product of vectors, but the "product" is not limited thereto. For example, when the edge amount is defined by a scalar, the "product" is a product of scalars.

Also, in the present embodiment, the index acquisition circuit 155 masks a region corresponding to the background image (Equation (18)), of the edge image of the display image, and performs a sum-of-product operation using the edge image of the display image whose portion is masked (Equation (19)).

In this way, even in a case where an edge is included in the background, a sum-of-product operation of edge amounts can be performed while the edge is masked. That is, the degree of matching between the edges in the display image and the edges in the reference image can be evaluated without being affected by edges in the background, and therefore the accuracy of the error detection can further be improved.

Also, the present embodiment can be implemented as a following error detection method. That is, in this method, an index representing the degree of matching between a foreground image, which is an image of a given region of a display image, and a reference image is obtained based on the pixel values of the display image and the pixel values of the reference image, which is a reference with respect to the foreground image, or based on the pixel values of an edge image of the display image and the pixel values of an edge image of the reference image, and error detection is performed on the display image based on the index.

Also, the present embodiment can be implemented as a following error detection method. That is, in this method, a region of interest of a display image is analyzed, and an index that represents the similarity to a reference image is computed. The index is computed using a following technique (a) or (b). (a) Three-dimensional distance errors of pixels of a display image and a reference image (base signal) that have been subjected to subsampling are compared. (b) Three-dimensional distance errors of edges (first-derivative of an image) of the display image and the reference image are compared.

4. Modifications

In the above-described embodiment, a case where the error detection method of the invention has been applied to a display controller (TCON: Timing CONtroller) has been described as an example, but the application target of the invention is not limited thereto. That is, the invention can be applied in any stage of processing performed on a display image or a transfer path of the display image.

For example, a display driver that drives a display panel may be the circuit device to which the invention is applied. In this case, an interface to which image data is input, in the display driver, corresponds to the image acquisition circuit, and the error detection circuit is provided between the interface and a drive circuit, for example. The error detection circuit performs the error detection of the invention on a given region (icon or the like) of an image received by the interface without performing overlaying or the like, for example.

Also, in the above-described embodiment, a case has been described, as an example, in which the image processing circuit 135 overlays an icon on an image (hereinafter, referred to as an input image) that has been input to the display controller and subjected to pre-processing, so as to generate the display image, but the application target of the invention is not limited thereto. That is, in the invention, any image can be acquired as the display image.

For example, the image itself that the image acquisition circuit has acquired may be the display image. In this case, the interface 110 corresponds to the image acquisition circuit. Alternatively, the input image itself that the pre-processing circuit 125 outputs may be the display image. In these cases, an icon, for example, is already included in the image acquired by the image acquisition circuit or in the input image, and a region including the icon or the like is set as the region of interest.

Alternatively, the image processing circuit 135 may use an image obtained by performing scaling processing on an input image as the display image. In this case, an icon is included in the input image, for example, the icon is scaled, and a region including the scaled icon is set as the region of interest.

Alternatively, the image processing circuit 135 may use an image obtained by performing gamma conversion processing (tone conversion processing) on an input image as the display image. In this case, an icon is included in the input image, for example, the icon is gamma-converted, and a region including the gamma-converted icon is set as the region of interest.

Alternatively, the image processing circuit 135 may use an image obtained by performing deformation processing on an input image as the display image. In this case, an icon is included in the input image, for example, the icon (or the entire input image) is deformed, and a region including the deformed icon is set as the region of interest. For example, there are cases where an image is deformed so as to be displayed in a head mounted display or the like.

Alternatively, an image stored in a memory is read out, and the read-out image may be set as the display image. In this case, a memory controller corresponds to the image acquisition circuit. Alternatively, the image acquisition circuit may use an image received by the interface as the display image. In this case, the interface corresponds to the image acquisition circuit.

5. Electronic Apparatus

Figure 19:
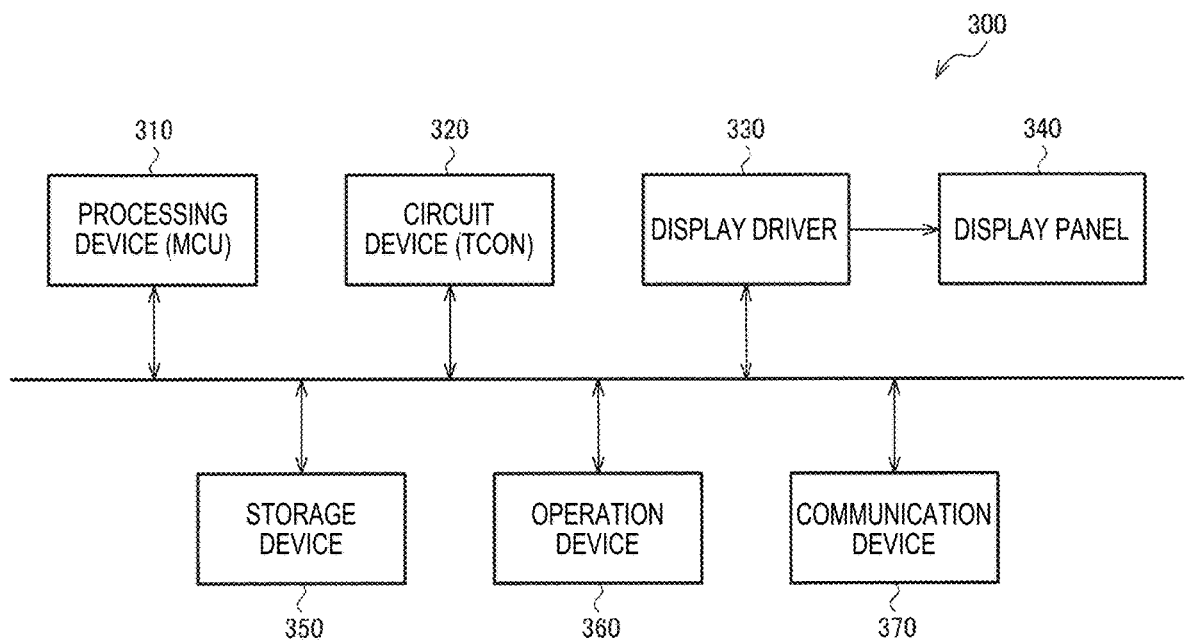
FIG. 19 shows an exemplary configuration of an electronic apparatus.

FIG. 19 shows an exemplary configuration of an electronic apparatus including the circuit device of the present embodiment. The electronic apparatus 300 includes a processing device 310, a circuit device 320, a display driver 330, a display panel 340, a storage device 350, an operation device 360, and a communication device 370. The processing device 310 is an MCU or the like, for example. The circuit device 320 corresponds to the circuit device 100 in FIGS. 1 and 2, and is a TCON, for example.

The processing device 310 transfers image data stored in the storage device 350, or image data received by the communication device 370 to the circuit device 320. The circuit device 320 performs image processing on image data, display timing control, error detection processing on image data to be transferred to a display driver, and the like. In error detection processing, the visibility index and the shape index are calculated, and error detection based on these indices is performed. The display driver 330 drives the display panel 340 so as to display an image based on image data transferred from the circuit device 320 and display timing control performed by the circuit device 320. The display panel 340 is a liquid-crystal display panel, an EL display panel, or the like. The storage device 350 is a memory, a hard disk drive, an optical disk drive, or the like. The operation device 360 is a device for allowing a user to operate the electronic apparatus 300, and is a button, a touch panel, a keyboard, or the like. The communication device 370 is a device for performing wired communication, or a device for performing wireless communication, for example. The wired communication is a LAN, a USB, or the like, for example. The wireless communication is a wireless LAN, proximity wireless communication, or the like, for example.

Various apparatuses such as an in-vehicle electronic apparatus, a display terminal of a plant facility, a display device mounted on an electronic apparatus, an information processing device, and a mobile information processing terminal are envisioned as an electronic apparatus including the circuit device of the present embodiment. The in-vehicle electronic apparatus is a meter panel or the like, for example. The information processing device is a PC or the like, for example. The mobile information processing terminal is a smartphone or the like, for example. The configuration of the electronic apparatus is not limited to that shown in FIG. 19, and various configurations can be adopted according to the application. For example, in the in-vehicle electronic apparatus, the circuit device 320, the display driver 330, the display panel 340, and the operation device 360 are incorporated into the meter panel, and the processing device 310, the storage device 350, and the communication device 370 are incorporated into the ECU (Electronic Control Unit). In this case, the meter panel corresponds to the electronic apparatus including the circuit device of the present embodiment.

Note that, although the present embodiment has been described in detail as described above, a person skilled in the art will appreciate that numerous modifications can be made without substantially departing from the novel matter and effects of the invention. Accordingly, all such modifications are intended to be embraced within the scope of the invention. For example, terms that appear in the description or drawings at least once together with other broader or synonymous terms can be replaced by those other terms in any part of the description or drawings. Also, all combinations of the present embodiment and the modifications are embraced within the scope of the invention. Also, the configurations and operations of the circuit device and the electronic apparatus are not limited to those described in the embodiment, and various modifications can be implemented.

What is claimed is:

1. A circuit device comprising:
an image acquisition circuit configured to acquire image data; and
an index acquisition circuit configured to obtain an index for performing error detection on a display image based on the image data, wherein
the index represents a degree of dissimilarity between a foreground image, which is an image of a given region of the display image, and a background image of the display image corresponding to a portion of the display image excluding the foreground image, and
the index is obtained based on pixel values of the display image.

2. The circuit device according to claim 1, further comprising
an image processing circuit configured to perform image processing on the image data so as to generate the display image, wherein
the index acquisition circuit is configured to obtain the index based on the pixel values of the display image generated by the image processing circuit.

3. The circuit device according to claim 1, wherein
the index acquisition circuit is configured to statistically obtain the index based on the pixel values of the display image.

4. The circuit device according to claim 1, further comprising
an index register for storing the index.

5. The circuit device according to claim 1, further comprising
an error detection circuit configured to perform the error detection on the display image based on the index.

6. The circuit device according to claim 5, wherein
the error detection circuit is configured to perform the error detection by comparing the index to a threshold value for determining an error in the display image.

7. The circuit device according to claim 6, further comprising
a threshold value register in which the threshold value is set.

8. The circuit device according to claim 7, further comprising
a memory into which the foreground image is stored as first to nth images, wherein:
the threshold value is set in the threshold value register as first to $n^{th}$ threshold values corresponding to the first to $n^{th}$ images,
when the error detection is performed on the display image that includes an $i^{th}$ image of the first to $n^{th}$ images as the foreground image, the error detection circuit performs the error detection using an $i^{th}$ threshold value of the first to $n^{th}$ threshold values, and
n is an integer equal to or greater than 2, and i is an integer equal to or smaller than n.

9. The circuit device according to claim 5, further comprising
an operation mode setting register in which an operation mode of the circuit device when an error is determined in the display image by the error detection circuit is set.

10. The circuit device according to claim 9, wherein,
in the operation mode setting register, a mode of reporting a result of the error detection to a device external to the circuit device, a mode of not displaying the display image, or a mode of displaying a specific image as the display image, is set as the operation mode.

11. The circuit device according to claim 5, further comprising:
a memory for storing first to $n^{th}$ images as foreground images; and
an operation mode setting register in which first to $n^{th}$ operation modes corresponding to the first to $n^{th}$ images are set, wherein
an $i^{th}$ operation mode of the first to $n^{th}$ operation modes is the operation mode of the circuit device when an error is determined in the display image by the error detection circuit, when the error detection circuit has performed the error detection on the display image including an $i^{th}$ image of the first to $n^{th}$ images as the foreground image, and
n is an integer equal to or greater than 2, and i is an integer equal to or smaller than n.

12. An electronic apparatus comprising the circuit device according to claim 1.

13. An error detection method comprising:
acquiring image data; and
obtaining an index that represents a degree of dissimilarity between a foreground image, which is an image of a given region of a display image based on the image data, and a background image of the display image corresponding to a portion of the display image excluding the foreground image, as the index for performing error detection on the display image, based on pixel values of the display image.

14. A circuit device comprising
at least one processor programmed to:
acquire image data;
generate a display image based on the image data; and
detect presence or absence of an error in the display image by analyzing pixel values of first and second portions of the display image, wherein the second portion of the display image corresponds to a portion of the display image excluding the first portion, wherein
the at least one processor obtains a degree of visibility of an image in the display image by analyzing the pixel values of the first and second portions of the display image.

15. The circuit device according to claim 14, wherein
the image is stored in a memory; and
the at least one processor generates the display image by making composite the image with the acquired image data.

16. The circuit device according to claim 14, wherein the at least one processor detects the presence or absence of the error in the display image without performing a bitwise error detection.

* * * * *